(12) United States Patent
Yamazaki et al.

(10) Patent No.: US 6,573,564 B2
(45) Date of Patent: *Jun. 3, 2003

(54) SEMICONDUCTOR DEVICE AND FABRICATION METHOD THEREOF

(75) Inventors: Shunpei Yamazaki, Tokyo (JP); Jun Koyama, Kanagawa (JP); Yurika Satou, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/141,821

(22) Filed: May 10, 2002

(65) Prior Publication Data
US 2002/0130363 A1 Sep. 19, 2002

Related U.S. Application Data

(62) Division of application No. 09/824,703, filed on Apr. 4, 2001, now Pat. No. 6,407,431, which is a division of application No. 09/157,941, filed on Sep. 22, 1998, now Pat. No. 6,218,219.

(30) Foreign Application Priority Data

Sep. 29, 1997 (JP) ............................................. 9-282559
Sep. 29, 1997 (JP) ............................................. 9-282560

(51) Int. Cl.$^7$ ......................... H01L 27/01; H01L 27/12; H01L 31/0392
(52) U.S. Cl. ......................... 257/353; 257/57; 257/344; 257/348; 257/458; 438/164; 438/149
(58) Field of Search ......................... 257/353, 57, 348, 257/344, 458; 438/164, 149

(56) References Cited

U.S. PATENT DOCUMENTS 5,198,694 A * 3/1993 Kwasnick et al. .......... 257/766
5,311,040 A * 5/1994 Hiramatsu et al. ............ 257/57
5,595,944 A    1/1997 Zhang et al.
5,643,826 A    7/1997 Ohtani et al.
5,677,211 A   10/1997 Kaneko
5,700,333 A   12/1997 Yamazaki et al.
5,821,133 A * 10/1998 Kawai et al. ................. 438/30
5,825,050 A   10/1998 Hirakawa
5,828,082 A   10/1998 Wu (List continued on next page.)

FOREIGN PATENT DOCUMENTS

JP    07-130652    5/1995
JP    08-015686    1/1996
JP    08-306639   11/1996

OTHER PUBLICATIONS

Hayashi et al., "Fabrication of Low–Temperature Bottom–Gate Poly–Si TFTs on Large–Area Substrate by Linear–Beam Excimer Laser Crystallization and Ion Doping Method", pp. 829–832, 1995, IEDM95.

Kim et al., SID 97 Digest, pp. 19–22, Jan. 1, 1997.

*Primary Examiner*—David Nelms
*Assistant Examiner*—Andy Huynh
(74) *Attorney, Agent, or Firm*—Nixon Peabody LLP; Jeffrey L. Costellia

(57) ABSTRACT

To provide a semiconductor device having high mass production performance and high reliability and reproducibility by simple fabrication steps, in a constitution of a semiconductor device of a bottom gate type formed by a semiconductor layer having a crystal structure, source and drain regions are constituted by a laminated layer structure comprising a first conductive layer ($n^+$ layer), a second conductive layer ($n^-$ layer) having resistance higher than the first conductive layer and an intrinsic or a substantially intrinsic semiconductor layer (i layer) in which the $n^-$ layer functions as an LDD region and the i layer functions as an offset region in a film thickness direction.

37 Claims, 19 Drawing Sheets

U.S. PATENT DOCUMENTS

| | | |
|---|---|---|
| 5,843,225 A | 12/1998 | Takayama et al. |
| 5,869,363 A | 2/1999 | Yamazaki et al. |
| 5,888,858 A | 3/1999 | Yamazaki et al. |
| 5,893,730 A | 4/1999 | Yamazaki et al. |
| 5,936,278 A | 8/1999 | Hu et al. |
| 5,949,115 A | 9/1999 | Yamazaki et al. |
| 5,961,743 A | 10/1999 | Yamazaki et al. |
| 5,985,740 A | 11/1999 | Yamazaki et al. |
| 6,013,930 A | 1/2000 | Yamazaki et al. |
| 6,027,731 A | 2/2000 | Pauza |
| 6,027,987 A | 2/2000 | Yamazaki et al. |
| 6,121,660 A | 4/2000 | Yamazaki et al. |
| 6,063,654 A | 5/2000 | Ohtani |
| 6,066,518 A | 5/2000 | Yamazaki |
| 6,072,193 A | 6/2000 | Ohnuma et al. |
| 6,077,731 A | 6/2000 | Yamazaki et al. |
| 6,048,758 A | 9/2000 | Yamazaki et al. |
| 6,204,535 B1 | 3/2001 | Yamazaki et al. |
| 6,218,219 B1 | 4/2001 | Yamazaki et al. |
| 6,255,668 B1 * | 7/2001 | Kang et al. ............... 257/59 |
| 6,387,737 B1 * | 5/2002 | Yamazaki et al. ........ 438/149 |
| 6,407,431 B2 * | 6/2002 | Yamazaki et al. ........ 257/353 |

* cited by examiner

SEMICONDUCTOR DEVICE AND FABRICATION METHOD THEREOF

BACKGROUND OF THE INVENTION

1. Field of the Invention

The present invention relates to a semiconductor device utilizing a semiconductor thin film having a crystal structure and a fabrication method thereof. Particularly, the present invention relates to a semiconductor device using a thin film transistor (hereinafter, abbreviated as TFT) having an inverted stagger structure.

Further, "semiconductor device" in the specification designates all of devices operated by utilizing semiconductor properties. Accordingly, all of TFTs, AMLCDs (Active Matrix Type Liquid Crystal Display Device) and electronic devices described in the specification are included in the category of semiconductor devices.

2. Description of Related Art

Conventionally, there has been utilized TFT as a switching element of an active matrix type liquid crystal display device (hereinafter, abbreviated as AMLCD). Currently, a product constituting a circuit by TFT utilizing an amorphous silicon film as an active layer is predominant in the market. As structure of TFT, an inverted stagger structure the fabrication steps of which are simple has been adopted frequently.

However, high function formation of AMLCD has been progressed year by year and operational function (particularly, operational speed) requested to TFT tends to become severe. Therefore, it is difficult to provide an element having sufficient function with operational speed of TFT using an amorphous silicon film.

Hence, TFT utilizing a polycrystal silicon film (polysilicon film) has been spotlighted in place of an amorphous silicon film and development of TFT with a polycrystal silicon film as an active layer has been progressed with significant vigor. At present, product formation thereof has also been carried out partially.

Many presentations have already been carried out in respect of a structure of an inverted stagger type TFT utilizing a polycrystal silicon film as an active layer. For example, there have been reports of "Fabrication of Low-Temperature Bottom-Gate Poly-Si TFTs on Large-Area Substrate by Linear-Beam Excimer Laser Crystallization and Ion Doping Method: H. Hayashi et. al., IEDM 95, pp.829–832, 1995", the disclosure of which is herein incorporated by reference, and so on.

According to the report, an explanation has been given of a typical example of an inverted stagger structure utilizing a polycrystal silicon film (FIG. 4), however, the inverted stagger structure of such a structure (so-called channel stop type) poses various problems.

First, a total of an active layer is extremely thin to about 50 nm and accordingly, impact ionization is caused at a junction between a channel forming region and a drain region and deteriorating phenomena of hot carrier injection and the like significantly emerge. Therefore, there causes a necessity of forming a large LDD region (Light Doped Drain Region).

Further, controllability of the LDD region for these is the most important problem. In an LDD region, control of a concentration of impurities and a length of the region is very delicate and particularly, control of length becomes problematic. At current state, a system for prescribing a length of an LDD region by a mask pattern is adopted, however, when miniaturization is promoted, slight patterning error causes a significant difference in properties of TFT.

A variation in sheet resistance of an LDD region caused by a variation in a film thickness of an active layer poses a serious problem. Further, a variation in a taper angle or the like of a gate electrode can be a factor causing a variation in the effect of an LDD region.

Further, a patterning step is needed to form an LDD region which gives rise to an increase in fabrication steps as it is and a deterioration in throughput. According to an inverted stagger structure described in the report mentioned above, it is anticipated that 6 sheets of masks at minimum (until formation of source and drain electrodes) are necessary.

As mentioned above, according to an inverted stagger structure of a channel stop type, LDD regions must be formed on both sides of a channel forming region and in a plane in the horizontal direction and it is very difficult to form a reproducible LDD region.

Further, the conventional AMLCD is provided with a structure in which a storage capacitance is installed to each pixel to compensate for leakage of electric charge held in a liquid crystal layer.

SUMMARY OF THE INVENTION

It is a problem of the present invention to provide a technology for fabricating a semiconductor device having high mass production performance and high reliability and reproducibility by very simple fabrication steps and to provide a constitution of a semiconductor device capable of fabricating without complicating steps and without particularly increasing a number of masks in fabricating a storage capacitance along with a bottom gate type TFT in a pixel matrix circuit and a method of fabricating thereof.

According to a first aspect of the present invention, there is provided a semiconductor device including a pixel matrix circuit comprising a plurality of gate wirings, a plurality of source wirings, a plurality of bottom gate type thin film transistors arranged to respective pixels and storage capacitances connected to pixel electrodes:

wherein a thin film semiconductor layer formed with a source region, a drain region and at least one channel forming region of each of the thin film transistors includes a crystal structure;

wherein each of the source region and the drain region includes a laminated layer structure comprising at least a first conductive layer, a second conductive layer having resistance higher than resistance of the first conductive layer and a first semiconductor layer having a conductive type the same as a conductive type of the channel forming region toward a gate insulating film;

wherein a concentration profile of an impurity for providing conductivities to the first and the second conductive layers is varied continuously from the first conductive layer to the second conductive layer; and wherein the storage capacitance comprises a first electrode comprising a conductive film the same as the gate wiring, a dielectric body in contact with the first electrode and a second electrode comprising a second semiconductor layer in contact with the dielectric body and provided with a conductive type the same as the conductive type of the channel forming region.

Further, according to another aspect of the present invention, in the pixel matrix circuit having the above-described constitution, in place of using a semiconductor layer in the second electrode of the storage capacitance, the second electrode is formed by a conductive film common to a conductive film of the source wiring.

Further, according to another aspect of the present invention, in the pixel matrix circuit having the above-described constitution, the pixel electrode and the second electrode of the storage capacitance are formed by a conductive film common to a conductive film of the source wiring.

Further, according to another aspect of the present invention, in the pixel matrix circuit mentioned above, one electrode of the storage capacitance is formed by a conductive film common to a conductive film of the gate wiring, the pixel electrode includes a region in contact with a dielectric body of the storage capacitance and the pixel electrode is used for one electrode of the storage capacitance.

Further, in a thin film transistor arranged in a pixel matrix circuit according to the present invention, a thin film semiconductor layer in which source and drain regions and a channel forming region are formed, is provided with a grain boundary distribution particular to a film of molten crystals.

Further, according to another aspect of the present invention with regard to a method of fabricating a semiconductor device, there is provided a method of fabricating a semiconductor device comprising:

a step of forming the gate wirings and a first electrode of the storage capacitance over a substrate having an insulating surface;

a step of forming an insulating layer covering the gate wirings and the first electrode;

a step of forming an amorphous semiconductor film on the insulating layer;

a step of adding a catalyst element promoting crystallization to the amorphous semiconductor film and providing a semiconductor film having a crystal structure by a heating treatment;

a step of forming a conductive layer by adding an impurity selected from either of group 15 and group 13 or only group 15 to the semiconductor film having the crystal structure;

a step of gettering the catalyst element in the semiconductor film having the crystal structure to the conductive layer by a heating treatment;

a step of forming a first thin film semiconductor layer constituting a channel forming region of the thin film transistor and a second thin film semiconductor layer overlapping the first electrode via the insulating layer by patterning the semiconductor film having the crystal structure;

a step of forming the source wiring, a first conductive film covering at least regions for forming a source region and a drain region of the thin film transistor above the first thin film semiconductor layer and a second conductive film covering a surface of the second thin film semiconductor layer; and a step of forming a channel forming region of the thin film transistor by etching the first thin film semiconductor layer with the first conductive film as a mask;

wherein a second electrode of the storage capacitance is formed in the second thin film semiconductor layer.

Further, according to another aspect of the present invention, in the pixel matrix circuit mentioned above, one electrode of the storage capacitance is formed by a conductive film common to a conductive film of the gate wiring, the pixel electrode includes a region in contact with a dielectric body of the storage capacitance and the pixel electrode is used for one electrode of the storage capacitance.

Further, in a thin film transistor arranged in a pixel matrix circuit according to the present invention, a thin film semiconductor layer in which source and drain regions and a channel forming region are formed, is provided with a grain boundary distribution particular to a film of molten crystals.

Although according to the fabrication method mentioned above, one electrode of the storage capacitance is formed in the semiconductor layer, according to other constitution with regard to a fabrication method of the present invention, a second electrode of the storage capacitance is formed with the source wiring and the source electrode and the drain electrode of the thin film transistor and a conductive film common to a conductive film of the source wiring is used as an electrode of the storage capacitance.

Further, according to other method, the pixel electrode is used for an electrode of the storage capacitance by forming the pixel electrode to be brought into contact with the pixel TFT and the dielectric body of the storage capacitance.

DETAILED DESCRIPTION OF THE PREFERRED EMBODIMENTS

Figure 1A:
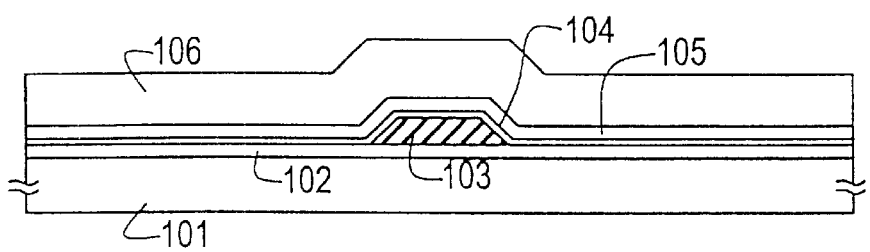
FIGS. 1A, 1B, 1C, 1D and 1E are views showing fabrication steps of a thin film transistor of Embodiment 1.

A detailed explanation will be given of embodiments according to the present invention comprising constitutions mentioned above, in respect of embodiments described below, particularly Embodiment 14 and following embodiments.

[Embodiment]

A detailed explanation will be given of embodiments according to the present invention in reference to the drawings.

[Embodiment 1]

An explanation will be given of a representative embodiment according to the present invention in reference to FIGS. 1A–1E, 2A–2D and 3. First, an explanation will be given of a method of fabricating a semiconductor device according to the present invention in reference to FIGS. 1A–1E.

A base film 102 comprising an insulating film whose major component is silicon is formed on a glass substrate (or quartz, silicon substrate) 101. On top thereof, a gate electrode (first wiring) comprising a conductive film 103 is formed.

A line width of the gate electrode 103 is set to 1–10 $\mu$m (representatively, 3–5 $\mu$m). Further, the film thickness is set to 200–500 nm (representatively, 250–300 nm). In this embodiment, a gate electrode having a line width of 3 $\mu$m is formed by using a Ta/TaN (tantalum/tantalum nitride) laminated layer film having a thickness of 250 nm.

Further, a material having heat resistance withstanding temperature of at least 600° C. (preferably, 800° C.) (tantalum, tungsten, titanium, chromium, molybdenum, conductive silicon or the like) is used for the gate electrode 103. The reason will be mentioned later. Here, a first patterning step (gate electrode formation) is carried out.

Next, a gate insulating layer comprising a silicon nitride film 104 (film thickness; 0–200 nm, representatively, 25–100 nm, preferably, 50 nm) and a silicon oxynitride film designated by $SiO_xN_y$ or a silicon oxide film (film thickness; 150–300 nm, representatively, 200 nm) 105 is formed and on top thereof, an amorphous semiconductor film 106 whose major component is silicon is formed. Although the embodiment shows an example of an amorphous silicon film, other compound semiconductor film (amorphous silicon film including germanium or the like) may be used.

Further, the present invention is of a bottom gate structure of a channel etch type and accordingly, the film thickness of the amorphous silicon film 106 is formed thick. A range of film thickness is set to 100–600 nm (typically, 200–300 nm, preferably, 250 nm). According to the embodiment, it is set to 200 nm. Further, although mentioned later, an optimum film thickness needs to determine pertinently by how to provide offset region or LDD region to TFT according to the present invention.

Further, the amorphous silicon film 106 is formed by a low pressure CVD (Chemical Vapor Deposition) process according to the embodiment, and it is preferable in the film forming operation to thoroughly control a concentration of impurities of carbon, oxygen and nitrogen. When the amount of the impurities is large, crystallization may be hampered in later steps.

According to the embodiment, concentrations of respective impurities in a formed amorphous silicon film are controlled such that concentrations of carbon and nitrogen are less than $5\times10^{18}$ atoms/cm$^3$ (representatively, $5\times10^{17}$ atoms/cm$^3$ or less) and a concentration of oxygen is less than $1.5\times10^{19}$ atoms/cm$^3$ (representatively, $1\times10$ atoms/cm$^3$ or less). By carrying out such a control, the concentrations of impurities included in a channel forming region of TFT finally fall in the above-described ranges.

Figure 1B:
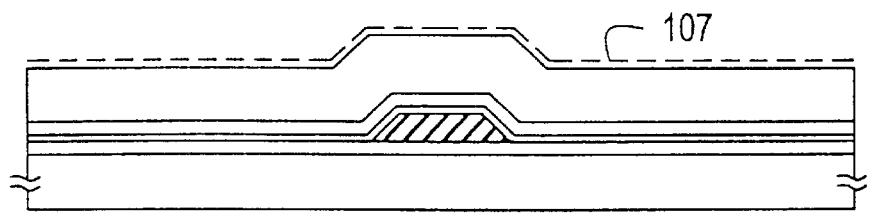

In this way, a state of FIG. 1A is provided. Next, a solution including a catalyst element promoting crystallization of silicon (representatively, nickel) is coated by a spin coating process and an Ni (nickel) including layer 107 is formed. In respect of detailed conditions, refer to a technology described in Japanese Patent Laid-Open No.7-130652 by the inventors (in this case, Embodiment 1 of the publication). Further, a technology described in Embodiment 2 of the publication may be used. (FIG. 1B)

Further, although in the publication, means of coating an aqueous solution including Ni is shown, the following adding means can be used.

(1) Direct addition by an ion implantation process or an ion doping process
(2) Addition by plasma treatment using an Ni electrode
(3) Formation of an Ni film or an $Ni_xSi_y$ (nickel silicide) film by a CVD process, a sputtering process or a vapor deposition process.

Further, as a catalyst element promoting crystallization of silicon, other than Ni, Ge (germanium), Co (cobalt), platinum (Pt), palladium (Pd), iron (Fe), copper (Cu), gold (Au), lead (Pb) or the like may be used.

Figure 1C:
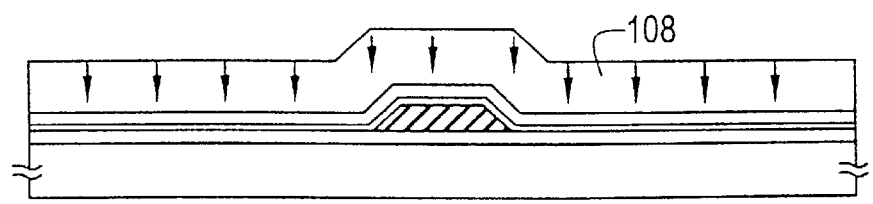

When the Ni including layer 107 is formed, after a heating treatment (dehydrogenating step) at 450–500° C. for about 2 hours, a heating treatment is carried out at temperature of 500–700° C. (representatively, 550–600° C.) for 2–12 hours (representatively, 4–8 hours) and a semiconductor film having a crystal structure (crystalline silicon film (polysilicon film) in the case of the embodiment) 108 is provided. In the case of the embodiment, crystallization is started from a vicinity of the surface of the amorphous silicon film 106 and is progressed substantially toward a direction of arrow marks. (FIG. 1C)

Figure 1D:
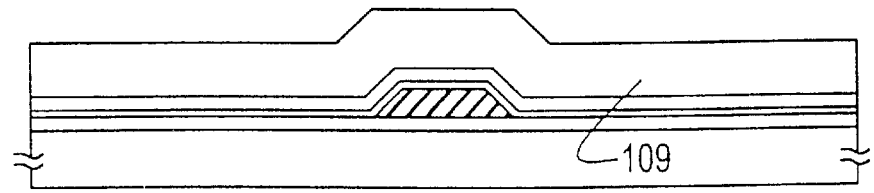

Next, a step of improving crystalline performance of the crystalline silicon film 108 is carried out by irradiating laser beam or strong beam having an intensity equivalent to that of laser beam. In this step, a reduction in intragrain defects, a reduction in unmatched grain boundaries, crystallization of an amorphous component are carried out and a crystalline silicon film 109 which is very excellent in crystalline performance is provided. (FIG. 1D)

Next, an element selected from group 15 (representatively, phosphorus, arsenic or antimony) is added by an ion implantation process (with mass separation) or an ion doping process (without mass separation). According to the embodiment, a concentration of phosphorus is adjusted to $1\times10^{19}$–$3\times10^{21}$ atoms/cm$^3$, representatively, $1\times10^{21}$–$1\times10^{21}$ atoms/cm$^3$ in a range of depth of 30–100 nm (representatively, 30–50 nm) from the surface of the crystalline silicon film 109.

In this embodiment, a region 110 including a high concentration of phosphorus formed in such a manner is referred to as an n+ layer (or first conductive layer). The thickness of the layer is determined in a range of 30–100 nm (representatively, 30–50 nm). In this case, the n+ layer 110 functions as portions of source and drain electrodes. In this embodiment, the n+ layer having the thickness of 30 nm is formed.

Figure 1E:
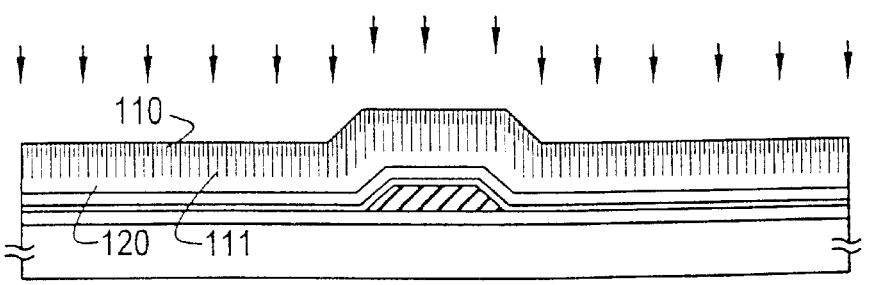

Further, a region 111 including a low concentration of phosphorus which is formed under the n+ layer 110 is referred to as an n− layer (or second conductive layer). In this case, the n− layer 111 is provided with resistance higher than resistance of the n+ layer 110 and functions as an LDD region for alleviating electric field. In this embodiment, the n− layer having a thickness of 30 nm is formed. (FIG. 1E)

Further, under the n− layer 111, an intrinsic or a substantially intrinsic region 120 is formed at a region where the concentration of phosphorus is extremely lowered and a layer therebelow. Such a region is referred to as an i layer 120.

Further, in this case, a concentration profile of the depth direction in adding phosphorus is very important. An explanation thereof will be given in reference to FIG. 4. Further, a concentration profile shown by FIG. 4 is an example in the case where phosphine ($PH_3$) is added by an ion doping process with an acceleration voltage of 80 kV and RF power of 20 W.

Figure 4:
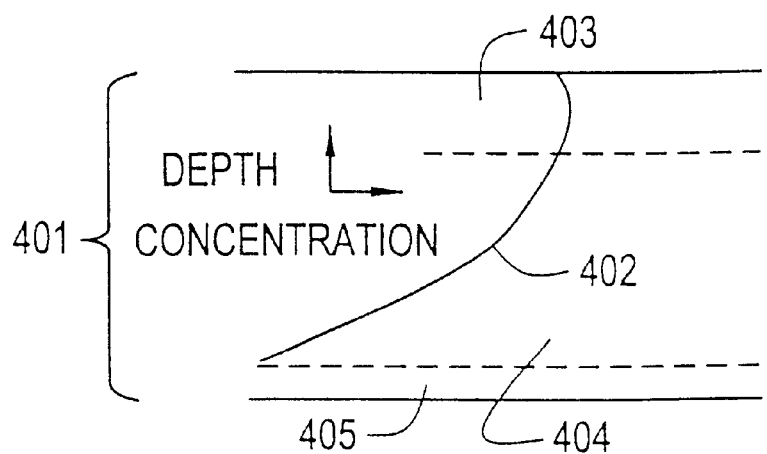
FIG. 4 is a view showing concentration profile in a film of Embodiment 2.

In FIG. 4, numeral 401 designates a crystalline silicon film, and numeral 402 designates a concentration profile of added phosphorus. The concentration profile is determined by conditions for setting RF power, kind of added ions, acceleration voltage and so on.

In this case, a peak value of the concentration profile 402 is disposed in an n+ layer 403 or at a vicinity of an interface thereof and the deeper a portion of the crystalline silicon film 401 (the more proximate to the gate insulating film), the lower the concentration of phosphorus becomes. In this case, the concentration of phosphorus is continuously changed over an entire region of the inside of the film and accordingly, an n− layer 404 is necessarily formed under the n+ layer 403.

Further, the concentration of phosphorus is continuously lowered also at the inside of the n− layer 404. According to the embodiment, a region where the concentration of phosphorus exceeds $1\times10^{19}$ atoms/cm$^3$ is regarded as the n+ layer 403 and a region in a range of concentration of $5\times10^{17}$–$1\times10^{19}$ atoms/cm$^3$ is regarded as the n− layer 404. However, a clear boundary is not existed and accordingly, the regions are regarded as criteria.

Further, an intrinsic or a substantially intrinsic region (i layer) 405 is constituted by a region where the concentration of phosphorus is extremely lowered or a layer thereunder. Further, a substantially intrinsic region designates a region in which a concentration of an impurity (in this case, concentration of phosphorus) is equal to or lower than spin density of a silicon film or a region in which the concentration of an impurity falls in a range of $1\times10^{14}$–$5\times10^{17}$ atoms/cm$^3$ and one conductivity is provided.

Although such an intrinsic or a substantially intrinsic region is formed under the n− layer 404, the i layer 405 is basically constituted by a semiconductor layer having a conductive type the same as that of a channel forming region. That is, when a channel forming region shows weak n-type or p-type, a similar conductive type is provided.

In this way, the n− layer 111 can be formed under the n layer 110 by using an ion implantation process or an ion doping process in forming the n+ layer 110. Such a constitution cannot be realized when the n+ layer is provided by film formation as in the conventional case. Further, by pertinently setting conditions in adding ions, thickness control of the n+ layer 110 and the n− layer 111 can easily be carried out.

Particularly, the thickness of the n− layer 111 constitutes a thickness of an LDD region in later steps and accordingly, very fine control is needed. According to an ion doping process or the like, by setting addition conditions, a concentration profile in the depth direction can finely be controlled and therefore, the thickness control of an LDD region can easily be carried out. According to the present invention, the thickness of the n− layer 111 may be adjusted in a range of 30–200 nm (representatively, 50–150 nm).

Although in FIG. 4, the concentration profile in the case where a doping step is carried out once is shown, by dividing the doping step into a plurality of steps, the thicknesses of the n+ layer 403 and the n− layer 404 can also be controlled. For example, there may be carried out doping operation in which the peak of the concentration profile is disposed at a comparatively shallow portion with high dose amount at a depth where the n+ layer 403 is to be formed and doping operation in which the peak of the concentration profile is disposed at a comparatively deep portion with low dose amount at a depth where the n− layer 404 is to be formed.

Figure 2A:
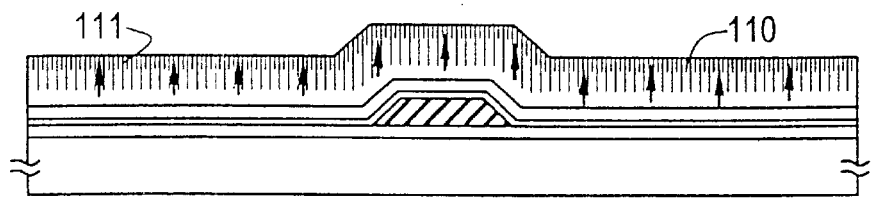
FIGS. 2A, 2B, 2C and 2D are views showing fabrication steps of a thin film transistor of Embodiment 1.

Next, when a state of FIG. 1E is provided, a heating treatment (furnace annealing) is carried out at temperature of 500–700° C. (representatively, 600–650° C.) for 0.5–8 hours (representatively, 1–4 hours) and Ni in a region where phosphorus of the crystalline silicon film is not added, is moved to the n+ layer 110 and the n− layer 111 where phosphorus is added. That is, Ni is diffused substantially toward a direction of arrow marks and gettered by the n+ layer 110 and the n− layer 111 and the concentration of nickel in the i layer 120 where a channel forming region is to be formed is reduced. (FIG. 2A)

By the gettering step of the embodiment, the concentration of nickel of the i layer 120 is reduced down to $5\times10^{17}$ atoms/cm or lower according to a measurement by SIMS (Secondary Ion Mass Spectroscopy). Further, by the gettering technology of the embodiment, the concentration of nickel can be reduced to the spin density of the i layer 120 or lower, $1\times10^{14}$ atoms/cm$^3$ or lower.

In this way, the embodiment is significantly characterized in that Ni is gettered by phosphorus included in the n+ 110 and the n− layer 111, that is, that the n+/n− layer is utilized as a gettering region. Further, although a portion of the n+/n− layer which has gettered Ni remains as it is as a first and a second conductive layer constituting source and drain regions, no problem is posed since inactive nickel phosphide is constituted after gettering operation.

Further, in this case, a distance which Ni is to be moved is only a distance in correspondence with the film thickness of the crystalline silicon film and accordingly, gettering operation is finished very swiftly (in short period of time). Therefore, (1) reduction in concentration of added phosphorus, (2) lowering of temperature of heating treatment and (3) shortening of time period of heating treatment can be realized.

Further, according to the embodiment, the maximum temperature of process is determined by the heat resistance of glass since TFT is fabricated on a glass substrate. However, when a substrate having high heat resistance such as a quartz substrate or the like is used as a substrate, the maximum temperature of heating treatment for gettering can be elevated up to 1000° C. (preferably, 800° C.). When the temperature exceeds 800° C., it is not preferable since inverse diffusion of phosphorus from a gettering region to a gettered region start to occur.

Further, the heat resistance of the gate electrode 103 is constituted to withstand temperature of 600° C. (preferably, 800° C.) in consideration of the gettering step. Naturally, when the gettering step is carried out not by furnace annealing but by lamp annealing or the like, the allowable range of the gate electrode is widened.

Figure 2B:
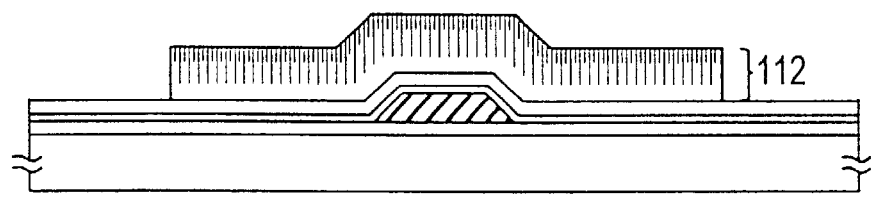

In this way, after gettering the catalyst element in the i layer 120 to the n+/n− layer, the crystalline silicon film is patterned and an island-like semiconductor layer 112 is formed. In this case, a length in a direction orthogonal to a direction of moving carriers (channel width (W)) when TFT is finally completed, is adjusted to 1–30 $\mu$m (representatively, 10–20 $\mu$m). At this stage, a second patterning step is carried out. (FIG. 2B)

At this stage, although not illustrated in the drawing, a portion of the exposed gate insulating later is etched and a contact hole for electrically connecting a gate electrode (first wiring) with a successively formed electrode (second wiring) (region designated by numeral 119 of FIG. 2D) is opened. At this stage, the third patterning step is carried out.

Figure 2C:
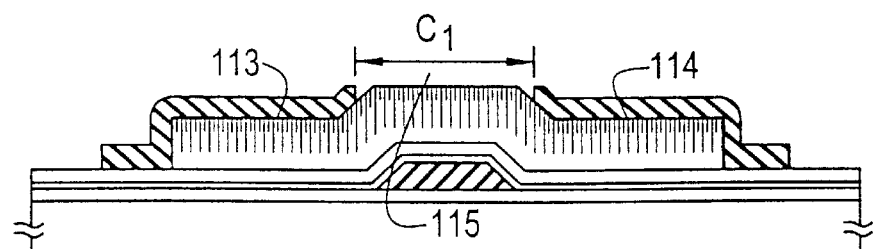

Next, a metal film having a conductivity (not illustrated) is formed and a source electrode 113 and a drain electrode 114 are formed by patterning. According to the embodiment, a laminated layer film comprising a three layer structure of Ti (50 nm)/Al (200–300 nm)/Ti (50 nm) is used. Further, as mentioned above, a wiring for electrically connecting to the gate electrode is simultaneously formed. At this stage, a fourth patterning step is carried out. (FIG. 2C)

Further, although mentioned later, a length (designated by notation $C_1$) of a region right above the gate electrode 103, that is, a region (hereinafter, referred to as channel etch region) 115 which is interposed between the source electrode 113 and the drain electrode 114, determines lengths of a channel forming region and offset regions at later steps. Although $C_1$ can be selected from a range of 2–20 $\mu$m (representatively, 5–10 $\mu$m), in this embodiment, $C_1$=4 $\mu$m.

Next, dry etching is carried out with the source electrode 113 and the drain electrode 114 as masks and the island-like semiconductor layer 112 is etched in a self-align manner. Therefore, etching is progressed only at the channel etch region 115. (FIG. 2D)

At this moment, the n+ layer 110 and the n− layer 111 are completely etched and etching operation is stopped in a configuration in which only the intrinsic or substantially intrinsic i layer 120 is left. According to the present invention, only a semiconductor layer of 10–100 nm (representatively, 10–75 nm, preferably, 15–45 nm) is finally left. In this embodiment, a semiconductor layer having a thickness of 30 nm is left.

Figure 2D:
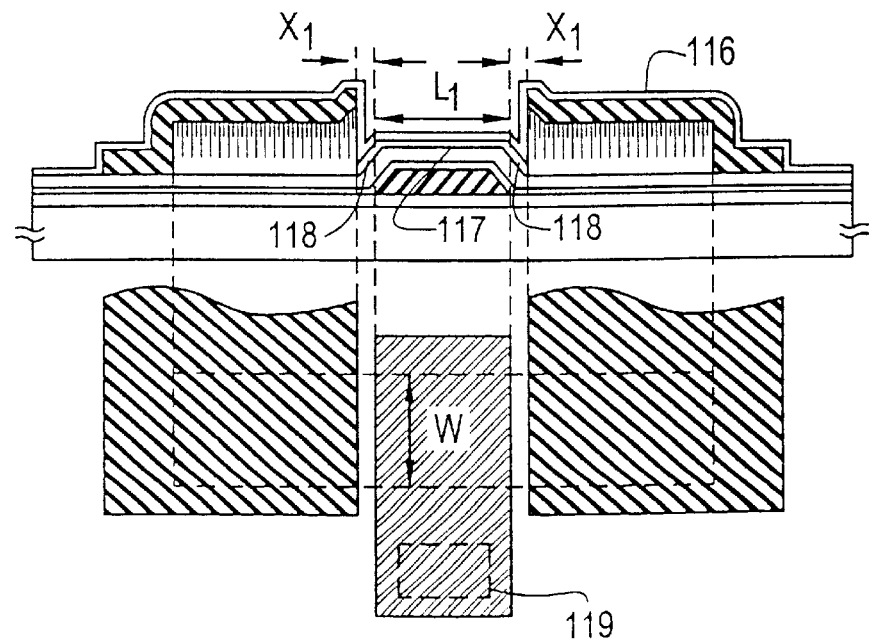

After finishing etching operation (channel etch step) of the island-like semiconductor layer 112, a silicon oxide film or a silicon nitride film is formed as a protective film 116 and an inverted stagger type TFT having a structure shown by FIG. 2D is provided.

Under the state, in the island-like semiconductor layer 112 which has been subjected to channel etch operation, a region disposed right above the gate electrode 103 constitutes a channel forming region 117. According to the constitution of the embodiment, the width of the gate electrode corresponds to a length of the channel forming region and a length designated by notation $L_1$ is referred to as a channel length. Further, regions 118 disposed outside of end portions of the gate electrode 103 constitute offset regions where electric field from the gate electrode 103 is not reached. A length thereof is designated by notation $X_1$.

In the case of the embodiment, a line width (which corresponds to $L_1$) of the gate electrode 103 is 3 $\mu$m and the length of the channel etch region 115 ($C_1$) is 4 $\mu$m and accordingly, the length of the offset region ($X_1$) is 0.5 $\mu$m.

Figure 3:
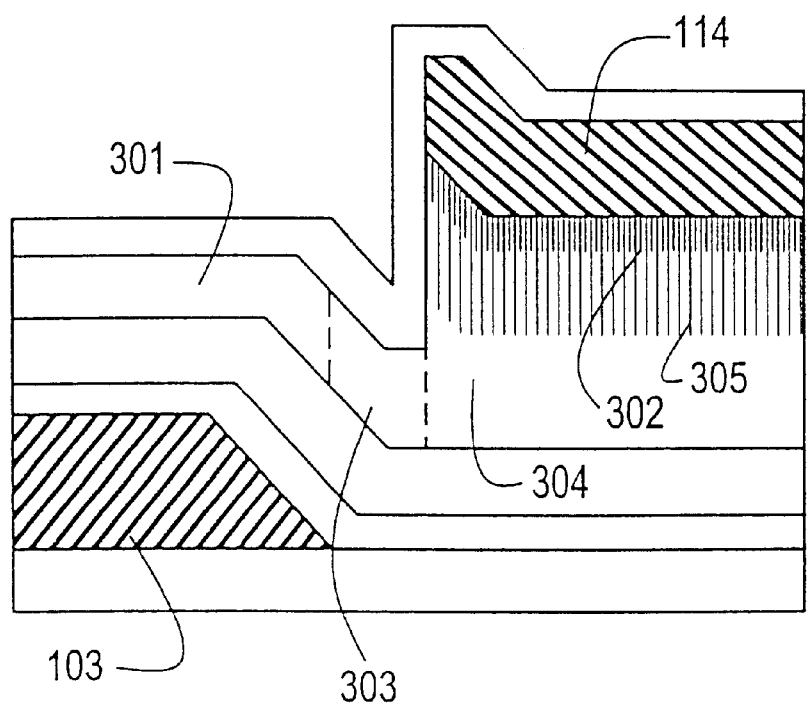
FIG. 3 is an enlarged view showing the constitution of a thin film transistor of Embodiment 1.

Here, FIG. 3 shows an enlarged view of a drain region (semiconductor layer in contact with drain electrode 114). In FIG. 3, numeral 103 designates the gate electrode, numeral 301 designates a channel forming region, numeral 302 designates an n+ layer (source or drain electrode), numerals 303 and 304 designate offset regions having different film thicknesses and numeral 305 designates an n− layer (LDD region).

Further, although not explained here, a source region (semiconductor layer in contact with the source electrode 113) is provided with a similar structure.

Further, although the structure shown by FIG. 3 is schematically illustrated, caution is required to a relationship among film thicknesses of respective regions. The present invention is constituted most preferably when film thicknesses are in a relationship of n+ layer 302<n− layer 305<offset region (i layer) 304.

Because the n+ layer 302 is sufficient to be thin since it functions only as an electrode. Meanwhile, the n− layer 305 and the offset region 304 need pertinent thicknesses for effectively alleviate electric field.

According to the constitution of the embodiment, the two offset regions 303 and 304 having different film thicknesses and the LDD region 305 are present from the channel forming region 301 to the n+ region 302. Further, numeral 303 designates the offset region in a direction of a film surface which is formed by mask alignment and the offset region is referred to as a mask offset region.

Further, numeral 304 designates the offset region in a direction of a film thickness in correspondence with the film thickness of the i layer and the offset region is referred to as a thickness offset region. The thickness of the thickness offset region 304 may be determined in a range of 100–300 nm (representatively, 150–200 nm). However, the film thickness needs to be larger than the film thickness of the channel forming region. When the film thickness is thinner than that of the channel forming region, excellent offset effect cannot be achieved.

Such a structure comprising offset+LDD is referred to as an HRD (High Resistance Drain) structure by the inventors and is considered to differ from a normal LDD structure. In the case of the embodiment, the HRD structure is constituted by three stage structure of mask offset+thickness offset+LDD.

In this case, the LDD region 303 is provided with advantages in which reproducibility is very excellent and a dispersion in properties is small since it is controlled by the film thickness and the concentration of impurities at the LDD region. In the LDD region formed by patterning, a dispersion in properties caused by an error in patterning becomes problematic as mentioned in the conventional example.

Further, the length ($X_1$) of the mask offset region 303 is controlled by patterning and accordingly, it suffers influence of error caused by contraction of glass or the like. However, the thickness offset region 304 and the LDD region 305 are present thereafter and accordingly, the influence caused by error is alleviated and the dispersion in properties can be reduced.

Further, the length ($X_1$) of the mask offset is represented by ($C_1$−$L_1$)/2 by using the channel length ($L_1$) and the length ($C_1$) of the channel etch region. Accordingly, a desired one of the offset length ($X_1$) can be set by the patterning step in forming source and drain electrodes. According to the constitution of the embodiment, the offset length ($X_1$) can be set to 0.3–3 $\mu$m (representatively, 1–2 $\mu$m).

Further, an inverted stagger type TFT having structure shown by FIG. 2D cannot be realized by TFT utilizing a conventional amorphous silicon film as an active layer (island-like semiconductor layer). Because when an amorphous silicon film is used, a mobility of a carrier (electron or hole) becomes extremely slow unless a structure in which source and drain electrodes and gate electrode overlap is constituted.

Even with a structure in which source and drain electrodes and gate electrode overlap, the mobility (field effect mobility) of TFT using an amorphous silicon film is at least about 1–10 cm²/Vs. In contrast thereto, when the structure as shown by the embodiment is adopted, the mobility is too low to function as a switching element.

However, according to the embodiment, the crystalline silicon film is utilized as an active layer and therefore, the carrier mobility is sufficiently fast. Therefore, even with the structure of the embodiment, sufficient mobility can be provided. That is, the structure of the embodiment can be realized since the semiconductor film having a crystal structure is used as the semiconductor layer.

Further, the inverted stagger type TFT of the embodiment is very strong at deteriorating phenomena of hot carrier injection by impact ionization and so on and is provided with high reliability since it has the HRD structure. Further, not only the effect of the LDD region is predominant but also the LDD region is formed with every excellent controllability and therefore, a dispersion in properties is very small.

Therefore, the structure of the embodiment is preferable to TFT which needs high withstand voltage and constitutes a circuit in which high operational speed is not so much necessary.

Further, as shown by the fabrication steps of the embodiment, only four sheets of masks are needed to provide the inverted stagger type TFT having a structure shown by FIG. 2D. This signifies that the throughput and the yield are surprisingly promoted considering the fact that six sheets of masks are needed in the conventional channel stop type TFT.

As mentioned above, a bottom gate type TFT having high reliability and reproducibility can be fabricated by fabrication steps having high mass production performance according to the constitution of the embodiment.

Further, according to the bottom gate type TFT (N-channel type TFT) fabricated in accordance with the fabrication steps of the embodiment, there can be achieved the mobility of 30–250 cm²/Vs (representatively, 100–150 cm²/Vs) and the threshold voltage of 0–3 V.

[Embodiment 2]

This embodiment is an example of crystallizing an amorphous silicon film by laser without using a catalyst element in Embodiment 1. An explanation will be given of a representative embodiment of the present invention in reference to FIGS. 5A–5D, 6A–6C and 7.

The line width of a gate electrode 203 is set to 1–10 $\mu$m (representatively, 3–5 $\mu$m). Further, the film thickness is set to 200–500 nm (representatively, 250–300 nm). According to the embodiment, a gate electrode having the line width of 3 $\mu$m is formed by using an aluminum film (including 2 wt % of scandium) having a thickness of 250 nm.

Further, other than aluminum, the gate electrode 203 can use tantalum, tungsten, titanium, chromium, molybdenum, conductive silicon, metal silicide, laminated layer films of these and so on. At this stage, a first patterning step (gate electrode formation) is carried out.

At this stage, the gate electrode 203 is anodized and an anodic oxide film 204 for protecting the gate electrode is formed by a thickness of 50–200 nm (typically, 100–150 nm). In this embodiment, the anodic oxide film 204 is formed under conditions of applied voltage of 80 V and formation current of 5–6 mA in an ethylene glycol solution including 3% of tartaric acid (neutralized to neutral by ammonia). Thereby, the anodized film 204 can be formed by a thickness of about 100 nm.

Next, a gate insulating layer comprising a silicon nitride film 205 (film thickness; 0–200 nm, representatively, 25–100 nm, preferably, 50 nm) and a silicon oxynitride film designated by $SiO_xN_y$ or a silicon oxide film (film thickness; 150–300 nm, representatively, 200 nm) 206 is formed. Further, in the case of the embodiment, the anodic oxide film 204 is also included in the gate insulating layer.

After forming the gate insulating layer, an amorphous semiconductor film 207 whose major component is silicon is formed thereon. Although according to the embodiment, an example of the amorphous silicon film is shown, other compound semiconductor film (amorphous silicon film including germanium or the like) may be used.

Further, the present invention is provided with a bottom gate structure of a channel etch type and accordingly, the film thickness of the amorphous silicon film 207 is formed thick. A range of the film thickness is set to 100–600 nm (typically, 200–300 nm, preferably, 250 nm). In this embodiment, the film thickness is set to 200 nm. Further, although mentioned later, an optimum film thickness needs to determine pertinently by how offset region and LDD region are installed in TFT according to the present invention.

Further, according to the embodiment, the amorphous silicon film 207 is formed by a low pressure CVD process and it is preferable to thoroughly control concentrations of impurities such as carbon, oxygen or nitrogen in film formation. When the amounts of these impurities are large, uniformity of crystalline performance of a crystalline semiconductor film may be deteriorated at later steps.

In this embodiment, concentrations of respective impurities in the formed amorphous silicon film are controlled such that concentrations of carbon and nitrogen are less than $5 \times 10^{18}$ atoms/cm³ (representatively, $5 \times 10^{17}$ atoms/cm³ or less) and a concentration of oxygen is less than $1.5 \times 10^{19}$ atoms/cm³ (representatively, $1 \times 10^{18}$ atoms/cm³ or less). When such a control is carried out, concentrations of impurities finally included in a channel forming region of TFT fall in the above-described ranges.

Figure 5A:
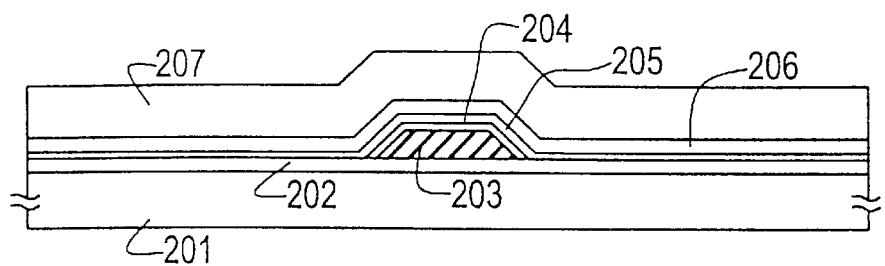
FIGS. 5A, 5B, 5C and 5D are views showing fabrication steps of a thin film transistor of Embodiment 2.
Figure 5B:
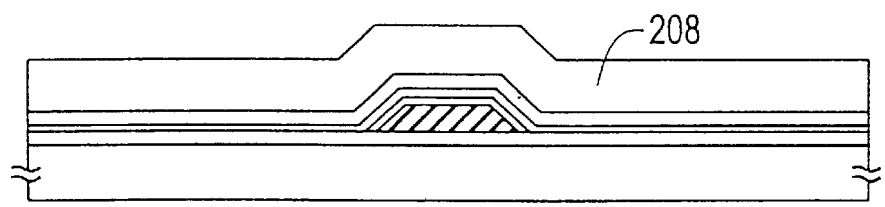

In this way, a state of FIG. 5A is provided. When the state of FIG. 5A is provided, the amorphous silicon film 207 is crystallized by irradiating laser beam. (FIG. 5B)

As laser beam, pulse oscillation type excimer laser using KrF (248 nm), XeCl (308 nm), ArF (193 nm) and the like as excitation gas may be used. Further, all the other laser beams such as harmonics of Nd:YAG laser or the like can be used.

Further, in the case where a film thickness of an amorphous semiconductor film to be crystallized is thick as in the embodiment, a total of the film is easy to crystallize uniformly by using laser beam having long wavelength. Further, in irradiating laser beam, a method of heating auxiliarily the substrate in a range of about 50–500° C. is also effective. Further, it is effective to adjust a film thickness such that light absorption efficiency is promoted in view of wavelength and period of laser beam.

According to the embodiment, XeCl excimer laser beam of a pulse oscillation type is fabricated linearly and is scanned from one end to the other end of a substrate by which laser annealing is carried out in respect of an entire face of the amorphous silicon film.

Further, oscillation frequency is set to 30 MHZ, scanning speed is set to 2.4 mm/s, laser energy is set to 300–400 mJ/cm$^2$ and the processing is carried out by heating the substrate to 400° C. from a rear face side. In this way, a crystalline semiconductor film (crystalline silicon film in this embodiment) 208 is provided.

Further, the heat absorption rate differs between the amorphous silicon film and the glass substrate and accordingly, when the beam is irradiated from the upper surface side of the film, temperature of the amorphous silicon film can concentratingly be elevated. Therefore, the amorphous silicon film can be heated at temperature of heat resistant temperature (near to 650° C.) of the glass substrate or higher.

Meanwhile, a semiconductor film crystallized by irradiating laser beam as in the embodiment (referred to as molten crystallized film in this specification) is provided with a grain boundary distribution (distribution of existence of crystal grain boundary) particular to laser crystallization. When crystal grain boundaries are made remarkable and observed by a publicly-known technology referred to as "seco-etching", crystal grains and grain boundaries can be clearly discriminated and the semiconductor film is found to be an aggregate of crystal grains having a grain size of several tens through several hundreds nm.

Meanwhile, a semiconductor film using other crystallizing means shows a grain boundary distribution which is clearly different from that of the molten crystallized film. Because according to crystallizing operation using Laser beam (or strong beam having intensity equivalent thereto), the semiconductor layer is once melted, however, in the case of the other means, the crystallization is carried out basically by solid phase growth and mechanisms of crystallization are different from each other.

Next, an element selected from group 15 (representatively, phosphorus, arsenic or antimony) is added by an ion implantation process (with mass separation) or an ion doping process (without mass separation). In this embodiment, the concentration of phosphorus is adjusted to $1 \times 10^{19} - 3 \times 10^{21}$ atoms/cm$^3$ representatively, $1 \times 10^{20} - 1 \times 10^{21}$ atoms/cm$^3$ in a range of depth of 30–100 nm (representatively, 30–50 nm) from the surface of the crystalline silicon film 208.

In this embodiment, a region 209 including a high concentration of phosphorus which is formed in this way is referred to as an n$^+$ layer (or first conductive layer). The thickness of the layer is determined in a range of 30–100 nm (representatively, 30–50 nm). In this case, the n$^+$ layer 209 functions as portions of source and drain electrodes in later steps. In this embodiment, the n$^+$ layer having a thickness of 30 nm is formed.

Figure 5C:
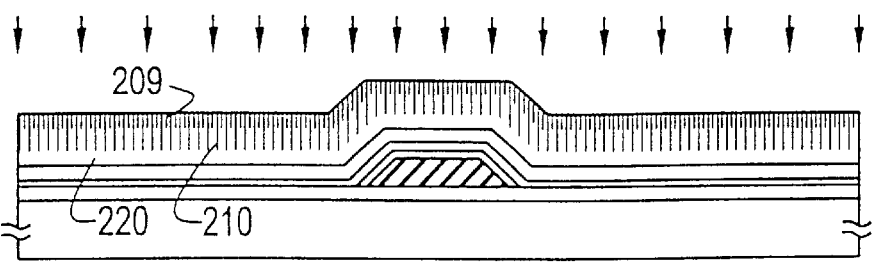

Further, a region 210 including a low concentration of phosphorus which is formed under the n$^+$ layer 209 is referred to as an n$^-$ layer (or second conductive layer). In this case, the n$^-$ layer 210 is provided with resistance higher than the n$^+$ layer 209 and functions as an LDD region for alleviating electric field in later steps. In this embodiment, the n$^-$ layer having a thickness of 30 nm is formed. Further, an intrinsic or substantially intrinsic region which is formed under the n$^-$ layer 210 is referred to as an i layer 220. A channel forming region is formed in the i layer 220. (FIG. 5C)

Further, a concentration profile in the depth direction in adding phosphorus is very important. This has been described in Embodiment 1.

Figure 5D:
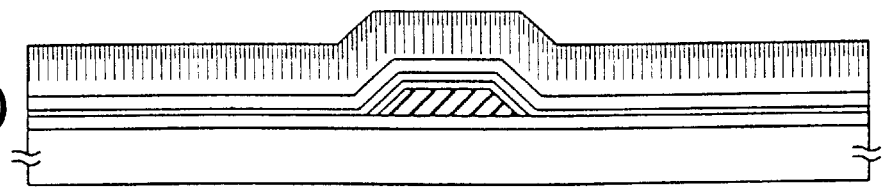

When the n$^+$ layer 209 and the n$^-$ layer 210 are formed in this way, irradiation of laser beam is again carried out and the added impurity (phosphorus) is activated. (FIG. 5D)

Further, other than laser annealing, lamp annealing (irradiation of strong beam) or furnace annealing (heating by an electric furnace) can also be carried out. However, in the case of furnace annealing, the processing needs to carry out in consideration of heat resistance of the glass substrate.

According to the embodiment, laser annealing is carried out by using XeCl excimer laser. The conditions of processing are basically the same as those in the crystallizing step mentioned above and laser energy may be set to 200–350 mJ/cm$^2$ (representatively, 250–300 mJ/cm$^2$). Further, the activation efficiency is promoted by heating the substrate to 300° C. on the rear surface side.

Further, in this laser activation step, damage which the crystalline silicon film 208 suffers in the step of adding phosphorus can be restored. Further, a region which is made amorphous by impingement of ions in the adding operation can be recrystallized.

Figure 6A:
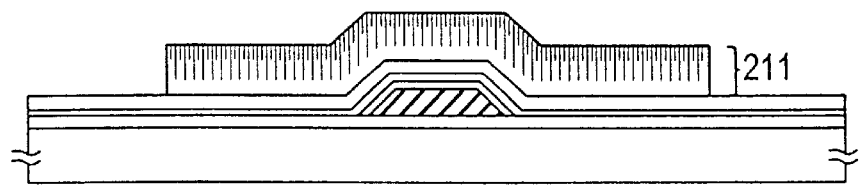
FIGS. 6A, 6B and 6C are views showing fabrication steps of a thin film transistor of Embodiment 2.

When the step of activating phosphorus has been finished, the crystalline silicon film is patterned and an island-like semiconductor layer 211 is formed. In this case, a length in a direction orthogonal to a direction of moving carriers when TFT is finally completed (channel width (W)) is adjusted to 1–30 μm (representatively, 10–20 μm). At this stage, a second patterning step is carried out. (FIG. 6A)

At this stage, although not illustrated in the drawing, a portion of an exposed gate insulating layer is etched and a contact hole for electrically connecting the gate electrode (first wiring) with a successively formed electrode (second wiring) (region designated by numeral 218 in FIG. 6C) is opened. At this step, a third patterning step is carried out.

Figure 6B:
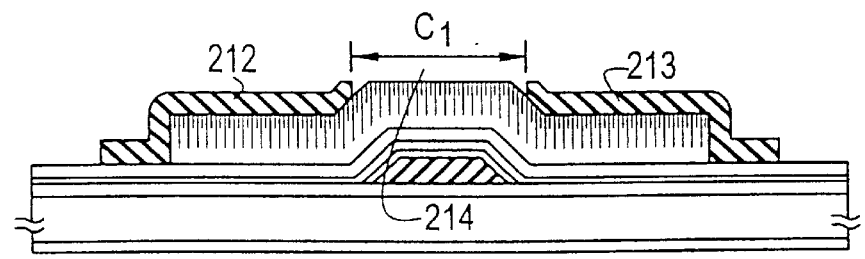

Next, a metal film having a conductivity (not illustrated) is formed and a source electrode 212 and a drain electrode 213 are formed by patterning operation. According to the embodiment, a laminated layer film comprising a three layers structure of Ti (50 nm) Al (200–300 nm)/Ti (50 nm) is used. Further, a wiring for electrically connecting the gate electrode is simultaneously formed as mentioned above. At this stage, a fourth patterning step is carried out. (FIG. 6B)

Further, although mentioned later, a length (designated by notation $C_1$) of a region right above the gate electrode 203, that is, a region 214 interposed between the source electrode 212 and the drain electrode 213 (hereinafter, referred to as channel etch region), determines lengths of a channel forming region and offset regions. Although $C_1$ can be selected from a range of 2–20 μm (representatively, 5–10 μm), in this embodiment, $C_1$=4 μm.

Next, dry etching is carried out with the source electrode 212 and the drain electrode 213 as masks and the island-like semiconductor layer 211 is etched in a self-align manner. Therefore, etching is progressed only at the channel etch region 214. (FIG. 6C)

In this case, the etching operation is stopped in a configuration in which the n$^+$ layer 209 and the n$^-$ layer 210 are completely etched and only the intrinsic or substantially intrinsic layer (i layer) is left. According to the present invention, only a semiconductor layer of 10–100 nm (representatively, 10–75 nm, preferably, 10–45 nm) is finally left. In this embodiment, a semiconductor layer having a thickness of 30 nm is left.

Figure 6C:
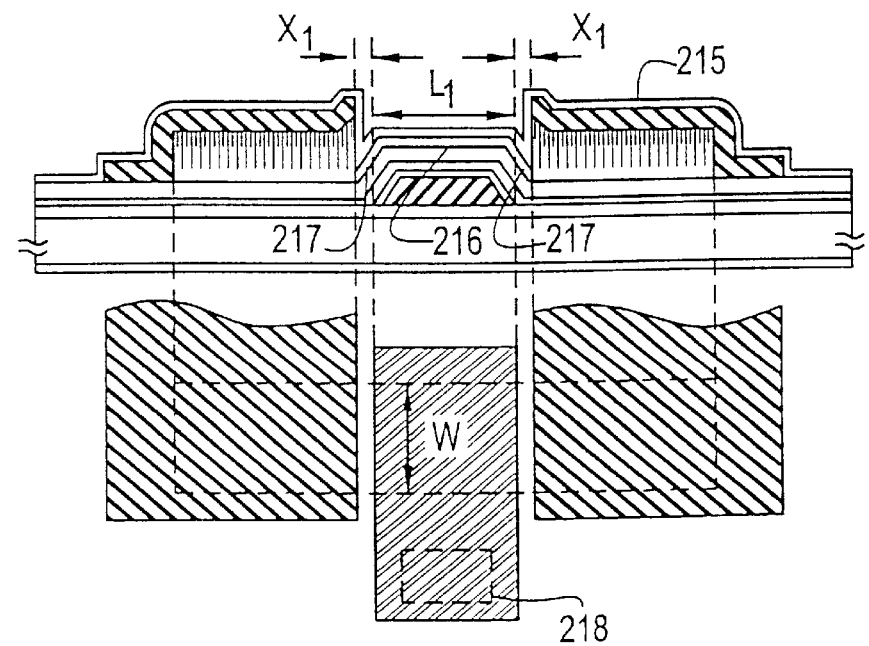

When etching (channel etch step) of the island-like semiconductor layer 211 has been finished, a silicon oxide film or a silicon nitride film is formed as a protective film 215 and an inverted stagger type TFT having a structure shown by FIG. 6C is provided.

In this state, in the island-like semiconductor layer 211 which has been subjected to channel etching, a region disposed right above the gate electrode 203 constitutes a channel forming region 216. According to the constitution of the embodiment, a width of the gate electrode corresponds to the length of the channel forming region and a length designated by notation $L_1$ is referred to as a channel length. Further, regions disposed outside of end portions of the gate electrode 203 constitute offset regions where electric field from the gate electrode 203 is not reached. The length is designated by notation $X_1$.

In the case of the embodiment, considering a reduction of the anodic oxide film portion having the thickness of 100 nm, the line width (which corresponds to $L_1$) of the gate electrode 203 is about 2.8 $\mu$m and the length ($C_1$) of the channel etch region 214 is 4 $\mu$m and accordingly, the length ($X_1$) of the offset region is about 0.6 $\mu$m.

Figure 7:
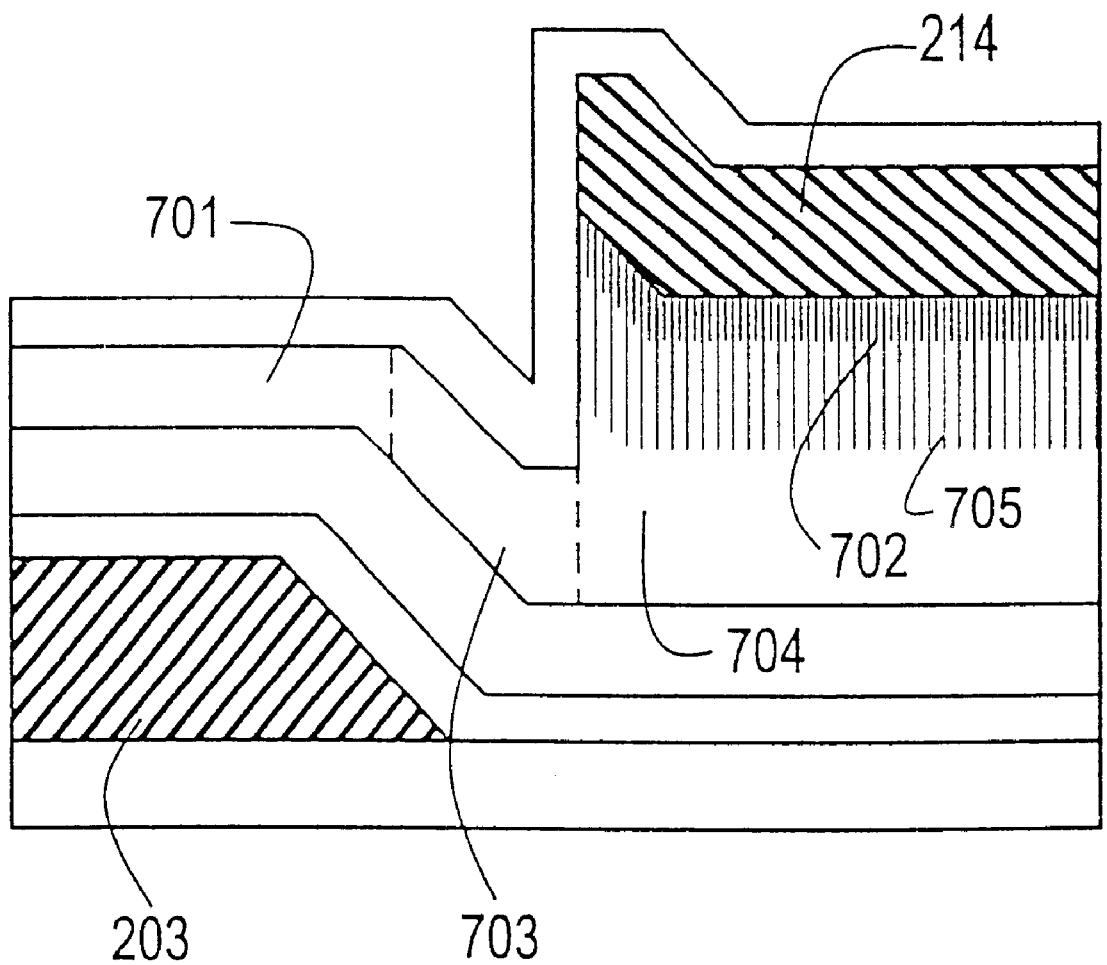
FIG. 7 is an enlarged view showing the constitution of a thin film transistor of Embodiment 2.

Here, FIG. 7 shows an enlarged view of a drain region (a semiconductor layer in contact with the drain electrode 213). In FIG. 7, numeral 203 designates the gate electrode, numeral 701 designates a channel forming region, numeral 702 designates an $n^+$ layer (source or drain electrode) and numerals 703 and 704 designate offset regions having different film thicknesses and numeral 705 designates an $n^-$ layer (LDD region).

Further, although not explained here, a source region (semiconductor layer in contact with the source electrode 212) is provided with a similar structure.

Further, although the structure shown by FIG. 7 is schematically illustrated, caution is required to a relationship among film thicknesses of respective regions. The present invention is constituted most preferably when film thicknesses are in a relationship of $n^+$ layer 702 < $n^-$ layer 705 < offset region (i layer) 704.

Because the $n^+$ layer 702 is sufficient to be thin since it functions only as electrode. Meanwhile, the $n^-$ layer 705 and the offset layer 704 need pertinent thicknesses to effectively alleviate electric field.

According to the constitution of the embodiment, the two offset regions 703 and 704 having different film thicknesses and the LDD region 705 are present between the channel forming region 701 to the $n^+$ region 702. Further, numeral 703 designates the offset region in a direction of a film surface formed by mask alignment and is referred to as mask offset region.

Further, numeral 704 designates the offset region in a direction of a film thickness in correspondence with the film thickness of the i layer and is referred to as thickness offset region. The thickness of the thickness offset region 704 may be determined in a range of 100–300 nm (representatively, 150–200 nm). However, the film thickness needs to be larger than the film thickness of the channel forming region. When the film thickness is thinner than that of the channel forming region, excellent offset effect cannot be provided.

Such a structure comprising offset+LDD is referred to as the HRD (High Resistance Drain) structure by the inventors and is considered to differ from a normal LDD structure. In the case of the embodiment, the HRD structure is constituted by a three stage structure of mask offset+thickness offset+LDD.

In this case, the LDD region 703 is provided with advantages in which the reproducibility is very excellent and dispersion in properties is small since it is controlled by the film thickness and the concentration of impurities of the LDD region. In the LDD region formed by patterning operation, a dispersion in properties caused by patterning error is problematic as mentioned in the conventional example.

Further, the length ($X_1$) of the mask offset region 703 suffers influence of error caused by patterning or contraction of glass or the like since it is controlled by the patterning operation. However, the thickness offset region 704 and the LDD region 705 are present thereafter and accordingly, influence by error is alleviated and the dispersion in properties can be reduced.

Further, the length ($X_1$) of the mask offset is represented by (C–L)/2 by using the channel length ($L_1$) and the length ($C_1$) of the channel etch region. Accordingly, a desired one of the offset length ($X_1$) can be set by the patterning step in forming source and drain electrodes. According to the constitution of the embodiment, the offset length ($X_1$) can be set to 0.3–3 $\mu$m (representatively, 1–2 $\mu$m).

Further, according to an inverted stagger type TFT having a structure as shown by FIG. 6C cannot be realized by TFT utilizing a conventional amorphous silicon film as an active layer (island-like semiconductor layer). Because when an amorphous silicon film is used, the mobility of carrier (electron or hole) becomes extremely slow unless a structure in which source and drain electrodes and a gate electrode overlap is constituted.

Even with the structure in which source and drain electrodes and a gate electrode overlap, the mobility (electric field effect mobility) using an amorphous silicon film is at least about 1–10 $cm^2$/Vs. In contrast thereto, when the structure as shown by the embodiment is adopted, the mobility is too low to function as a switching element.

However, according to the present invention, the crystalline silicon film is utilized as an active layer and accordingly, the carrier mobility is sufficiently fast. Therefore, even with the structure of the embodiment, sufficient mobility can be provided. That is, the structure of the embodiment can be realized only by using a semiconductor film having a crystal structure as a semiconductor layer.

Further, the inverted stagger type TFT of the embodiment is very strong at deteriorating phenomena of hot carrier injection by impact ionization and the like and is provided with high reliability since it has the HRD structure. Further, not only the effect of the LDD region is predominant but also the LDD region is formed with very excellent controllability and accordingly, a dispersion in properties is very small.

Therefore, the structure of the embodiment is preferable in TFT which needs high withstand voltage and constitutes a circuit in which high operational speed is not so much necessary.

Further, as shown by the fabrication steps of the embodiment, only four sheets of masks are needed to provide the inverted stagger type TFT having a structure shown by FIG. 6C. This signifies that the throughput and the yield are surprisingly promoted in consideration of the fact that six sheets of masks are needed in the conventional channel stop type TFT.

As mentioned above, according to the constitution of the embodiment, a bottom gate type TFT having high reliability and reproducibility can be fabricated by fabrication steps having high mass production performance.

Further, according to the bottom gate type TFT (N-channel type TFT) fabricated in accordance with the fabrication steps of the embodiment, the mobility of 10–150 $cm^2$/Vs (representatively, 60–120 $cm^2$/Vs) and the threshold voltage of 1–4 V can be realized.

[Embodiment 3]

According to the embodiment, in the constitution of the present invention, an example of a constitution different from those of Embodiments 1 and 2 will be shown. The fabrication steps of TFT are basically carried out in accordance with those in Embodiments 1 and 2 and accordingly, in this embodiment, an explanation will be given only of necessary portions.

Figure 8A:
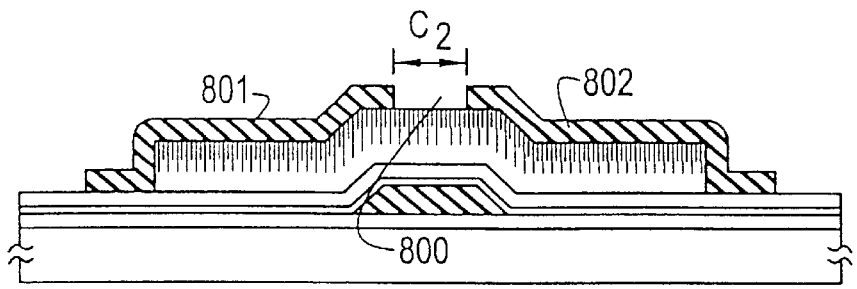
FIGS. 8A, 8B and 8C are views showing the constitution of a thin film transistor of Embodiment 3.

First, a state of FIG. 8A is provided in accordance with the fabrication steps of Embodiment 1 or Embodiment 2. In this case, a point different from Embodiments 1 and 2 resides in that a length of a channel etch region 800 is set to $C_2$ in forming a source electrode 801 and a drain electrode 802. In this case, $C_2$ is narrower than the width of the gate electrode and is selected in a range of 2–9 μm (representatively, 2–4 μm). It is the characteristic of this embodiment to provide a gate electrode and source and drain electrodes to overlap each other.

Figure 8B:
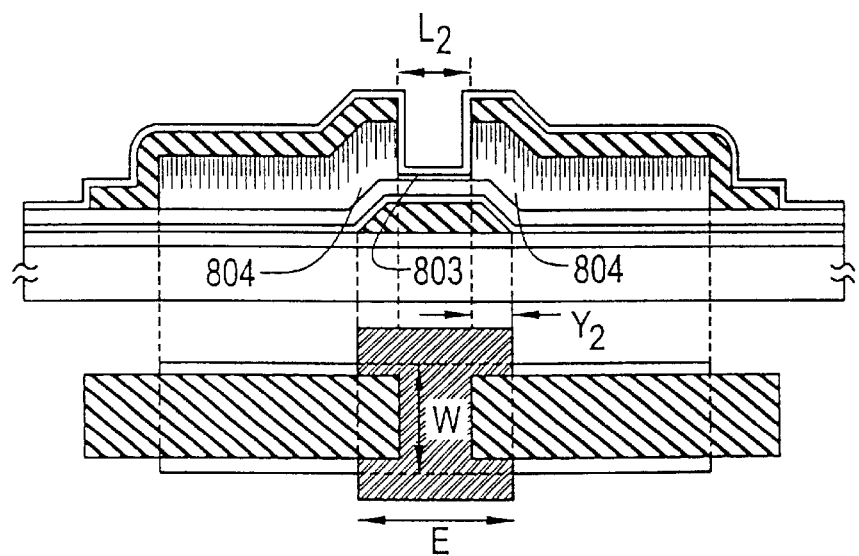

When the channel etch step is carried out as shown by Embodiment 1 or Embodiment 2 under the state and a protective film is provided, a state of FIG. 8B is provided. In this case, a region designated by numeral 803 constitutes a channel forming region and the length of the channel is designated by notation $L_2$ ($=C_2$). Further, a length ($Y_2$) of a region overlapped by mask design (referred to as mask overlap region) is represented by $(E-L_2)/2$ when the width of the gate electrode is set to notation E.

Figure 8C:
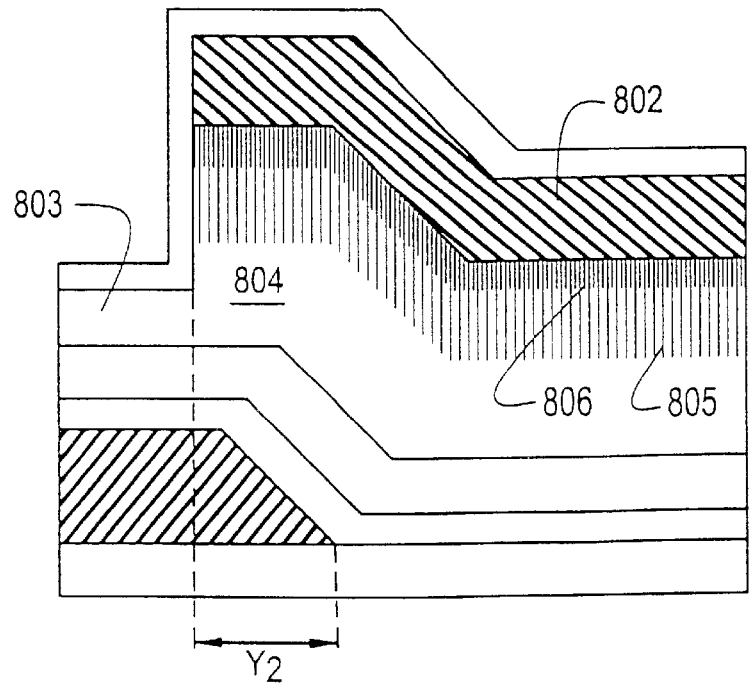

FIG. 8C is an enlarged view of a drain region in which carriers in operating TFT reach an $n^+$ layer 806 (thickness; 40 nm) and a drain electrode 802 via a channel forming region 803 (thickness; 50 nm), a mask overlap region 804 (thickness; 160 nm) and an LDD region 805 (thickness; 50 nm).

Further, in this case, although electric field from the gate electrode is formed also in the mask overlap region 804, the electric field is weakened as a portion thereof approaches the LDD region 805 and accordingly, such a region is provided with a function substantially similar to that of the LDD region. Naturally, when the portion approaches further to the LDD region 805, the electric field is not formed completely and the portion can function also as an offset (thickness offset) region.

In this way, according to the structure of the embodiment, the HRD structure is constituted by substantially an LDD formed by overlapping+thickness offset+LDD by low concentration impurity. Further, when the film thickness of the overlap region 804 is thin, an LDD structure only by substantially an LDD formed by overlapping+LDD by low concentration impurity can be formed.

Also in the constitution of the embodiment, the overlap region 804 and the LDD region 805 are controlled by respective film thicknesses and a dispersion in properties is very small. Further, although the length ($Y_2$) of the overlap region includes an error caused by patterning or the like, LDD by overlapping, offset in the thickness direction and LDD by low concentration impurity do not suffer influence of such an error and accordingly, a dispersion in properties caused by error of $Y_2$ is alleviated.

Further, the structure of the embodiment is preferable to TFT constituting a circuit in which the offset component is small and high operational speed is needed.

Further, the structure of the embodiment is provided with an advantage in which minority carriers accumulated in a channel forming region by impact ionization are drawn swiftly to a source electrode and accordingly, a substrate floating effect is difficult to cause. Therefore, TFT in which not only the operational speed is fast, but also very high withstand voltage characteristic is provided, can be realized.

[Embodiment 4]

According to the embodiment, in the constitution of the present invention, an example of a constitution different from those of Embodiments 1–3 will be shown. The fabrication steps of TFT are basically carried out in accordance with those of Embodiment 1 or 2 and accordingly, an explanation will be given only of a necessary portion according to the embodiment.

Figure 9A:
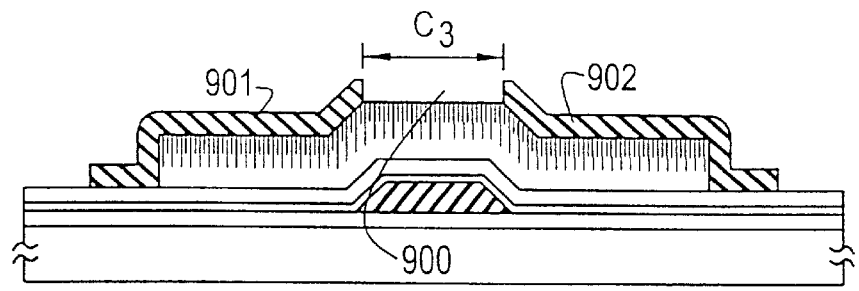
FIGS. 9A, 9B and 9C are views showing the constitution of a thin film transistor of Embodiment 4.

First, a state of FIG. 9A is provided in accordance with the fabrication steps of Embodiment 1 or 2. In this case, a point different from Embodiment 1 or 2 resides in that a length of a channel etch region 900 in forming a source electrode 901 and a drain electrode 902 is set to $C_3$. In this case, C is 1–10 μm (representatively, 3–5 μm) to coincide with a width of a gate electrode.

Figure 9B:
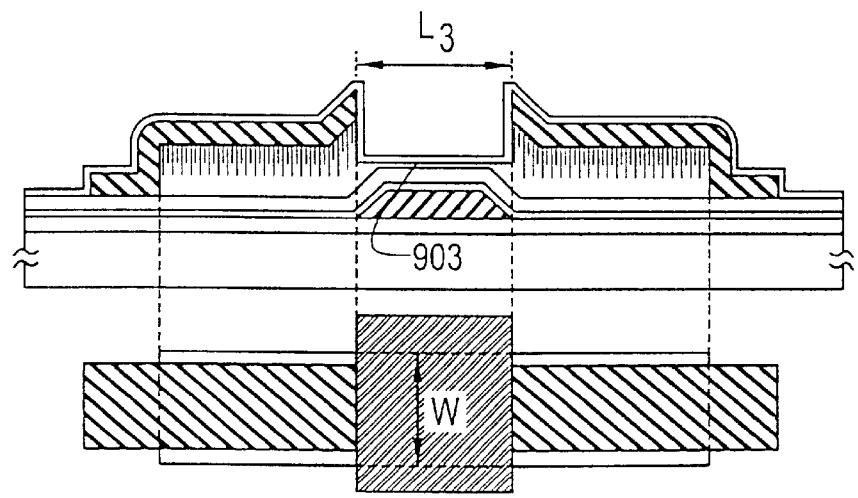

When a channel etch step is carried out under the state as shown by Embodiment 1 or 2 and a protective film is provided, a state of FIG. 9B is provided. In this case, a region designated by numeral 903 constitutes a channel forming region and a length of the channel is designated by notation $L_3$ ($=C_3$).

Figure 9C:
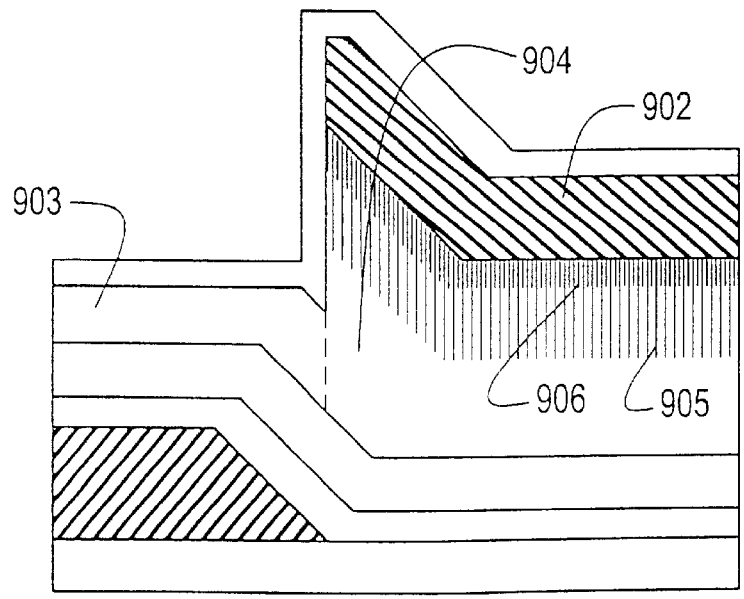

FIG. 9C is an enlarged view of a drain region in which carriers in operating TFT reach an $n^+$ layer 906 (thickness; 50 nm) and the drain electrode 902 via a channel forming region 903 (thickness; 100 nm), a thickness offset region 904 (thickness; 150 nm) and an LDD region 905 (thickness; 100 nm). That is, the structure of the embodiment is constituted by a two stage structure of thickness offset+LDD.

Also in the constitution of the embodiment, the thickness offset region 904 and the LDD region 905 are controlled by respective film thicknesses and accordingly, a dispersion in properties is small. Further, a sufficient withstand voltage characteristic can be provided.

[Embodiment 5]

In this embodiment, in the constitution of the present invention, an example of a constitution different from those in Embodiments 1–4 will be shown. The fabrication steps of TFT are carried out in accordance with those of Embodiment 1 or 2 and accordingly, an explanation will be given only of a necessary portion in the embodiment.

Figure 10A:
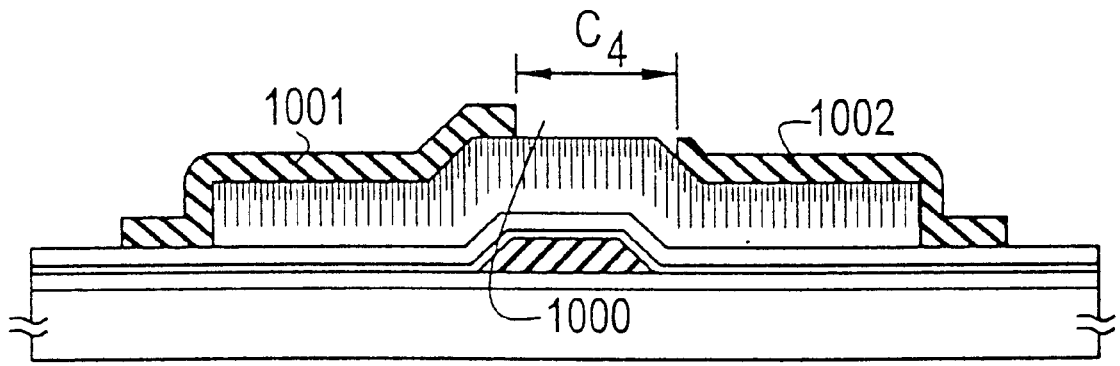
FIGS. 10A and 10B are views showing the constitution of a thin film transistor of Embodiment 5.

First, a state of FIG. 10A is provided in accordance with the fabrication steps of Embodiment 1 or 2. In this case, a point different from Embodiment 1 or 2 resides in that in forming a source electrode 1001 and a drain electrode 1002, either one of the source electrode and the drain electrode is made to overlap a gate electrode and the other thereof is not made to overlap the gate electrode.

Further, in this embodiment, a length of a channel etch region 1000 is set to $C_4$. In this case, $C_4$ is selected from a range of 1–10 μm (representatively, 3–6 μm).

Figure 10B:
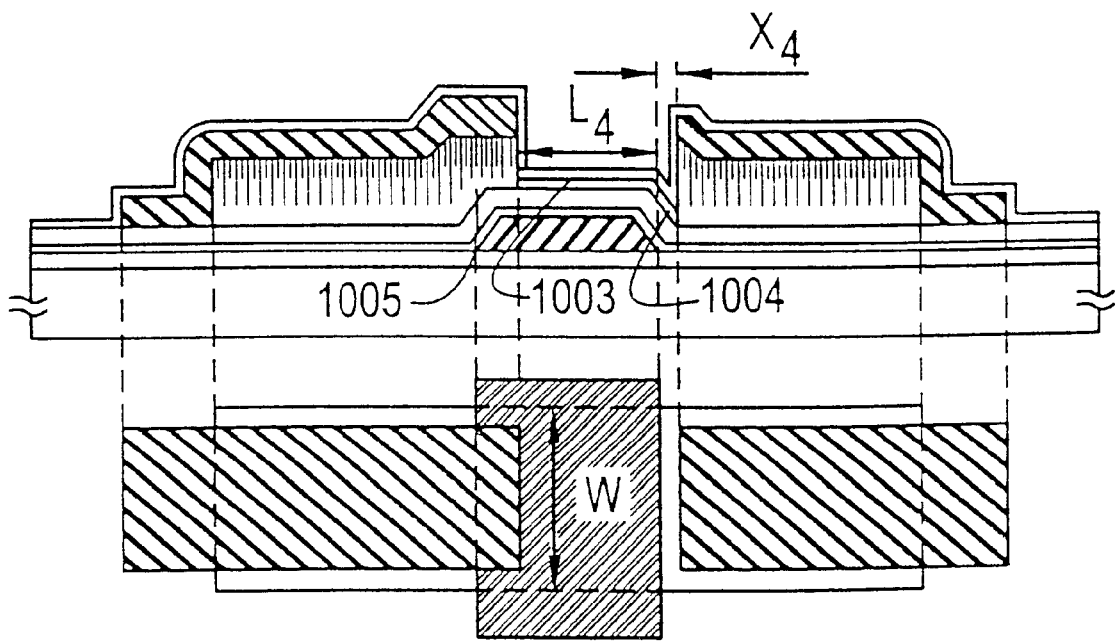

When the channel etch step is carried out as shown by Embodiment 1 under the state, and a protective film is provided, a state of FIG. 10B is provided. In this case, a region designated by numeral 1003 constitutes a channel forming region and a length of the channel is represented by notation $L_4$ ($=C_4-X_4$).

In this case, notation $X_4$ designates a length of a mask offset region 1004. In respect of a range of a numerical value of $X_4$, Embodiment 1 may be referred. Further, in respect of a range of a numerical value of a length of a mask overlap region 1005, Embodiment 3 may be referred.

The embodiment is provided with a constitution in which the HRD structure explained in Embodiment 1 and the HRD structure (LDD structure) explained in Embodiment 3 are combined. The structural explanation has already been given in Embodiment 1 and Embodiment 3 and therefore, an explanation thereof in this embodiment will be omitted.

When the structure as shown by the embodiment is adopted, particularly, it is preferable to use the HRD structure (or LDD structure) shown by Embodiment 3 in the source region and use the HRD structure explained in Embodiment 1 in the drain region.

For example, at an end portion (junction) of a channel on the side of the drain region, concentration of electric field is significant and the HRD structure having many resistance components as shown by Embodiment 1 is preferable. Conversely, on the side of the source, measure for high withstand voltage to that degree is not needed and accordingly, the HRD (or LDD) structure having few resistance components as shown by Embodiment 3 is suitable.

Further, in this embodiment, the structure of Embodiment 3 can be combined with either of source and drain region sides. In this way, a designer pertinently selects the HRD structure or the LDD structure shown by Embodiments 1–4 and adopts it in source and drain regions and an optimum structure may be designed in view of circuit design. In this case, combination patterns of $3^2=9$ ways are feasible.

[Embodiment 6]

In this embodiment, an explanation will be given of an example in the case where a CMOS circuit (inverter circuit) is constituted by using a bottom gate type TFT having the constitution shown by Embodiments 1–5 in reference to FIG. 11.

Further, the CMOS circuit is constituted by complimentarily combining an N-channel type TFT and a P-channel type TFT formed on the same substrate.

Figure 11:
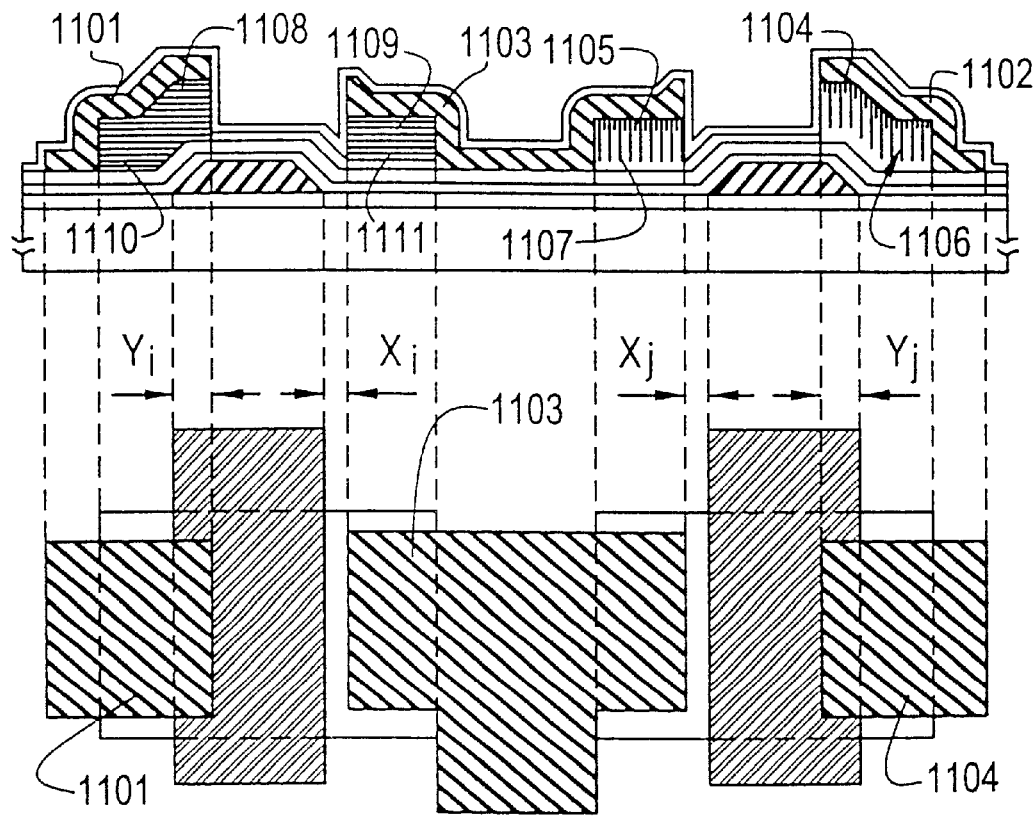
FIG. 11 is a view showing the constitution of a CMOS (Complementary Metal Oxide Semiconductor) circuit of Embodiment 6.

FIG. 11 shows a CMOS circuit utilizing the constitution shown by Embodiment 5 in which numeral 1101 designates a source electrode of a P-channel type TFT, numeral 1102 designates a source electrode of an N-channel type TFT and numeral 1103 designates a drain electrode which is common to the N-channel and P-channel type TFTs.

Further, the N-channel type TFT is formed with $n^+$ layers 1104 and 1105 and $n^-$ layers 1106 and 1107 by the fabrication steps explained in Embodiment 1 or 2. Meanwhile, the P-channel type TFT is formed with $p^{++}$ layers 1108 and 1109 and $p^-$ layers 1110 and 1111.

Further, it is very easy to fabricate a CMOS circuit on the same substrate. In the case of the present invention, first, the state of FIG. 2B or FIG. 6A is provided in accordance with the steps of Embodiment 1 or 2.

In this state, an element selected from group 15 is added on the entire face regardless of N-type or P-type and in fabricating the P-channel type TFT, an element selected from group 13 (representatively, boron, indium or gallium) may be added by concealing a region for constituting the N-channel type TFT by a resist mask or the like.

In this embodiment, boron is adopted as an example and in this case, boron must be added by a concentration which is equal to or larger than a concentration of phosphorus to revert the conductivity. Further, in order to revert completely all of the $n^+$ layer and the n layer into the p layer and the p layer, it is important that a concentration profile in adding boron is adjusted and boron is added deeper than a depth of adding phosphorus.

Figure 12:
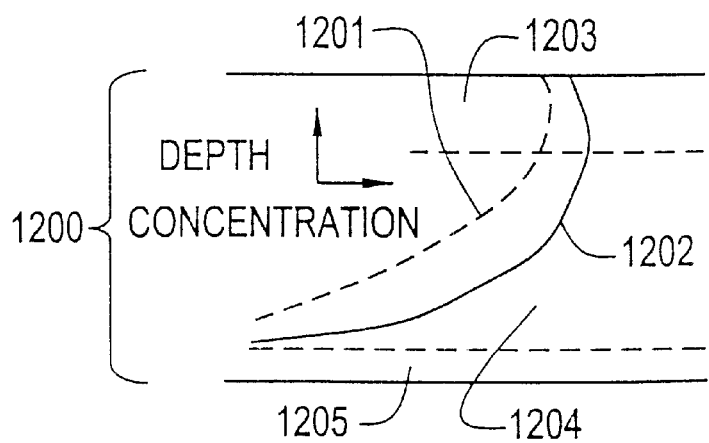
FIG. 12 is a view showing the concentration profile in a film of Embodiment 6.

Accordingly, the concentration profile of boron in the film is as shown by FIG. 12. In FIG. 12, numeral 1200 designates a semiconductor layer, numeral 1201 designates a concentration profile of phosphorus before adding boron, numeral 1202 designates a concentration profile of boron after adding boron, numeral 1203 designates a $p^{++}$ layer, numeral 1204 designates a $p^-$ layer and numeral 1205 designates an i layer.

In this case, a thickness of the $p^{++}$ layer 1203 is set to 10–150 nm (representatively, 50–100 nm) and a concentration of boron of the $p^{++}$ layer is adjusted to $3\times10^{19}$–$1\times10^{22}$ atoms/cm$^3$, representatively, $3\times10^{19}$–$3\times10^{21}$ atoms/cm$^3$.

Meanwhile, a thickness of the $p^-$ layer 1204 is set to 30–300 nm (representatively, 100–200 nm) and the concentration of boron is adjusted to $5\times10^{17}$–$3\times10^{19}$ atoms/cm$^3$. However, a P-channel type TFT is inherently strong at deterioration and therefore, there is not a necessity of utilizing the $p^-$ layer as an LDD region. A mention has expressly been given of the film thickness of the $p^-$ layer 1204 since the $p^-$ layer is necessarily formed by a continuously changing concentration gradient so far as adding means of ion implantation process or the like is used.

Meanwhile, according to the embodiment, the HRD structure (type utilizing overlap region) having the constitution shown by Embodiment 2 is used on the source region side and the HRD structure (type utilizing mask offset) having the constitution shown by Embodiment 1 is installed on the drain region side in either of the N-channel type TFT and the P-channel type TFT.

Therefore, as is apparent from the top view, the source region side of the P-channel type TFT is provided with an overlap region having a length of $Y_i$ and the drain region side thereof is provided with a mask offset region having a length of $X_i$. Further, the source region side of the N-channel type TFT is provided with an overlap region having a length of $Y_j$ and the drain region side thereof is provided with a mask offset region having a length of $X_j$.

In this case, lengths of $X_i$; and $X_j$, and $Y_i$ and $Y_j$ can freely be adjusted respectively by mask design. Accordingly, the respective lengths may pertinently be determined in accordance with a necessity in constituting a circuit and need not to align between the N-channel type and the P-channel type.

Further, according to such a structure, the withstand voltage characteristic of a region of the CMOS circuit for constituting the common drain can be promoted and therefore, it is a very effective constitution in the case where a circuit having high operational voltage is constituted.

Further, although FIG. 11 shows a constitution of CMOS circuit using TFTs having the constitutions shown by Embodiments 1–4, all of combinations other than the above-described is naturally feasible. As feasible constitution patterns, there are $9^2=81$ ways in the CMOS circuit since there are nine patterns with respect to one TFT. An optimum combination may be adopted in accordance with a function needed by a circuit from the plurality of combinations.

Further, as shown by the embodiment, the present invention is easily applicable also to a P-channel type TFT. In that case, according to the bottom gate type TFT (P-channel type TFT) of the present invention, the mobility of 30–150 cm$^2$/Vs (representatively, 50–100 cm$^2$/Vs) and the threshold voltage of $-1$–$-3$ V can be realized.

[Embodiment 7]

In this embodiment, an explanation will be given of an example in the case of utilizing Ge (germanium) as a catalyst element promoting to crystallize silicon. When Ge is utilized, it is preferable to add Ge by an ion implantation process, an ion doping process or a plasma treatment in view of excellence in general purpose use. Further, Ge can be added from a gas phase by carrying out heat treatment in an atmosphere including Ge.

Ge is an element belonging to group 14 the same as that of Si (silicon) and accordingly, the compatibility with Si is very excellent. It has already been described that a compound of Ge and Si (designated by $Si_xGe_{1-x}$, $0<X<1$) can be utilized also for a semiconductor layer of the present invention.

Therefore, in the case where crystallization of an amorphous silicon film using Ge is carried out as in the embodiment, the catalyst element needs not to getter after crystallization. Naturally, the gettering step can be carried out but no influence is effected on properties of TFT.

Therefore, the heating treatment of the gettering step can be omitted and therefore, the throughput of the fabrication steps is significantly promoted. Further, TFT using an $Si_xGe_{1-x}$ film is known to show high mobility and accordingly, promotion of operational speed can be expected when an amount of including Ge in a silicon film is pertinent.

Further, the constitution of the embodiment is applicable to any constitution of Embodiments 1–6.

[Embodiment 8]

In this embodiment, an explanation will be given of an example in the case where TFT according to the present invention is devised for controlling threshold voltage.

A technology of adding an element selected from group 13 (representatively, boron, indium and gallium) or group 15 (representatively, phosphorus, arsenic and antimony) to a channel forming region for controlling threshold voltage is referred to as channel dope.

It is effective to carry out channel dope in the present invention and the following two ways of methods are simple and excellent.

First, there is a system in which at a time point of forming an amorphous silicon film, a gas for forming a film is mixed with a gas including an impurity for controlling the threshold voltage (for example, diborane, phosphine or the like) and a predetermined amount thereof is included simultaneously with film formation. In this case, although a number of steps need not to increase at all, impurities of the same concentration are added to both N-type and P-type TFTs and therefore, the system cannot meet a request for making the concentrations of both of TFTs different from each other.

Next, there is a system in which after finishing a channel etch step (step of forming channel forming region) as explained in reference to FIG. 2D, impurities are added selectively to a channel forming region (or channel forming region and mask offset region) with source and drain electrodes as masks.

Although various processes of an ion implantation process, an ion doping process, a plasma treatment process, a gas phase process (diffusion from atmosphere), a solid phase process (diffusion from inside of film) and so on can be used as adding processes, a process inflicting no damage is preferable as in a gas phase process, a solid phase process or the like since the channel forming region is thin.

Further, in the case of using an ion implantation process or the like, in the case where the process is carried out after providing a protective film covering a total of TFT, damage of a channel forming region can be alleviated.

Further, after adding impurities, a step of activating the impurities is carried out by laser annealing, lamp annealing, furnace annealing or combination of these. In this case, the channel forming region is almost restored from damage which the channel forming region has undergone.

In carrying out the embodiment, an impurity for controlling threshold voltage may be added to the channel forming region by a concentration of $1\times10^{15}$–$5\times10^{18}$ atoms/cm$^3$ (representatively, $1\times10^{15}$–$5\times10^{17}$ atoms/cm$^3$).

Further, when the embodiment is carried out on TFT of the present invention, the threshold voltage of an N-channel type TFT can fall in a range of 0.5–2.5 V. Further, when it is applied to a P-channel type TFT, the threshold voltage can fall in a range of –0.1—2.0 V.

Further, the constitution of the embodiment can be combined with any of the constitutions of Embodiments 1–7. Further, when it is applied to the CMOS circuit of Embodiment 6, concentrations of addition and kinds of impurities to be added can be made different from each other between the N-type TFT and the P-type TFT.

[Embodiment 9]

According to the structure shown by FIG. 2D, the source electrode 113 and the drain electrode 114 are formed to completely surround the island-like semiconductor layer. In this embodiment, an explanation will be given of a constitution different therefrom.

Figure 13A:
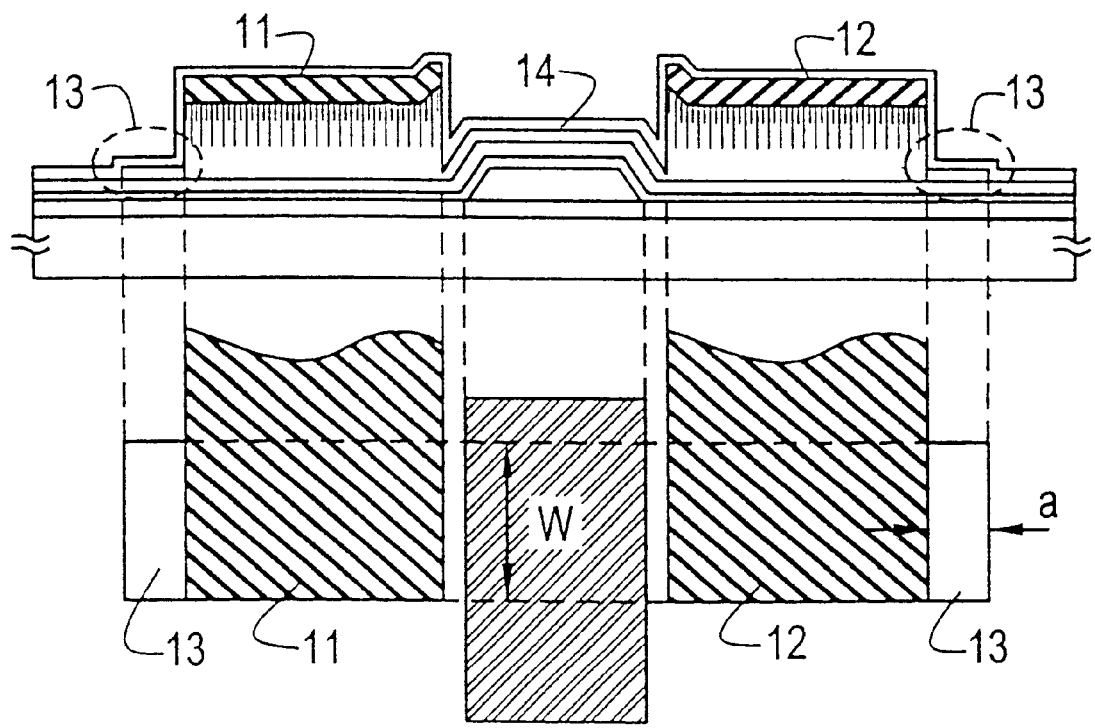
FIGS. 13A and 13B are views showing the constitution of a thin film transistor of Embodiment 9.

Although a structure shown by FIG. 13A is basically similar to that in FIG. 2D, a characterizing point resides in that shapes of a source electrode 11 and a drain electrode 12 are different therefrom. That is, at portions thereof, the source electrode 11 and the drain electrode 12 are formed on the inner sides of the island-like semiconductor layer (strictly speaking, source and drain regions) by a distance designated by notation "a".

Further, a region designated by numeral 13 is a region having a film thickness the same as that of a channel forming region 14 and is provided with a width of distance "a". Although illustrated schematically in the drawing, distance "a" is 1–300 μm (representatively, 10–200 μm).

Figure 13B:
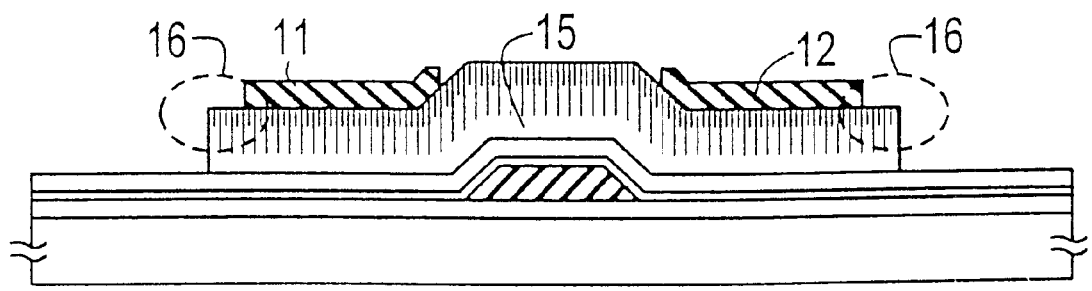

In this case, an explanation will be given of characteristics of the embodiment in view of fabrication steps. In this embodiment, the source electrode 11 and the drain electrode 12 are formed as shown by FIG. 13B. In the drawing, numeral 15 designates an island-like semiconductor layer and end portions 16 thereof are exposed.

When the channel etch step is carried out under the state, the island-like semiconductor layer 15 is etched in a self-align manner with the source electrode 11 and the drain electrode 12 as masks. In this case, the end portions 16 are simultaneously etched.

In this way, the structure shown by FIG. 13A is provided. Accordingly, it is apparent that the end portions 16 are provided with a film thickness the same as that of the channel forming region 14.

The projected portion 13 of the island-like semiconductor layer are formed by the following two reasons.

(1) They are utilized as an etching monitor in the channel etch step.
(2) They reduce coverage failure caused by stepped difference of the island-like semiconductor layer in forming a protective film or an interlayer insulating film at later steps.

The etching monitor is used in the case in which whether the channel forming region is provided with a pertinent film thickness is inspected by a sampling inspection in a fabrication procedure.

Further, the constitution of the embodiment can be combined with any of the constitutions of Embodiments 1–7.

[Embodiment 10]

In this embodiment, an explanation will be given of an example of a circuit constitution of a CMOS circuit (inverter circuit) shown by Embodiment 6 in reference to FIGS. 14A, 14B and 14C.

Figure 14A:
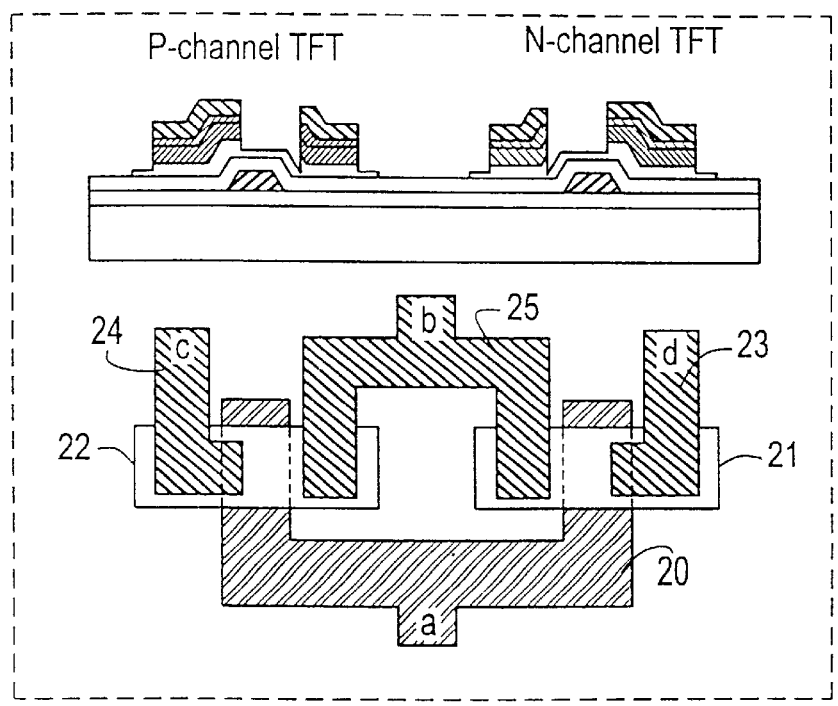
FIGS. 14A, 14B and 14C are views showing the constitution of a CMOS circuit of Embodiment 10.

FIG. 14A shows a CMOS circuit having a structure the same as that shown by FIG. 11. In this case, the circuit is constituted by a gate electrode 20, a semiconductor layer 21 of an N-type TFT, a semiconductor layer 22 of a P-type TFT, a source electrode 23 of the N-type TFT, a source electrode 24 of the P-type TFT and a common drain electrode 25.

Figure 14B:
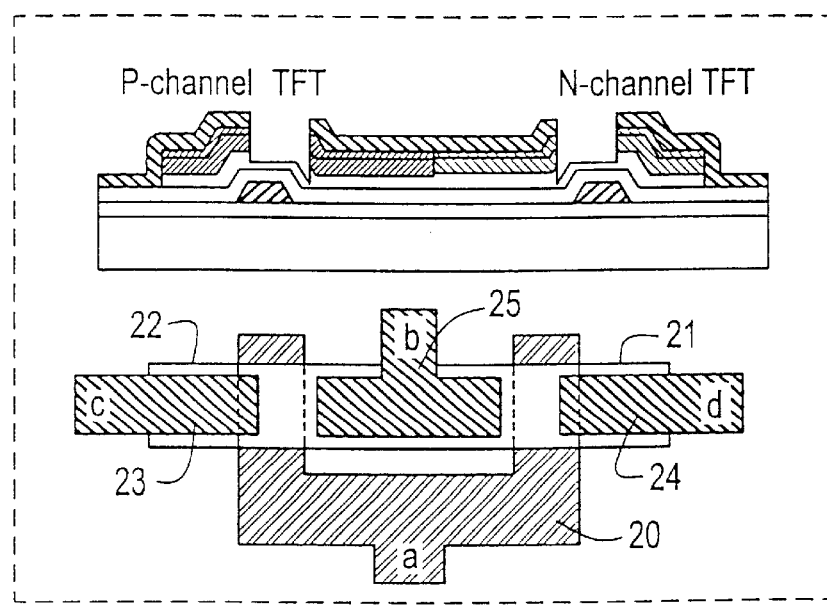
Figure 14C:
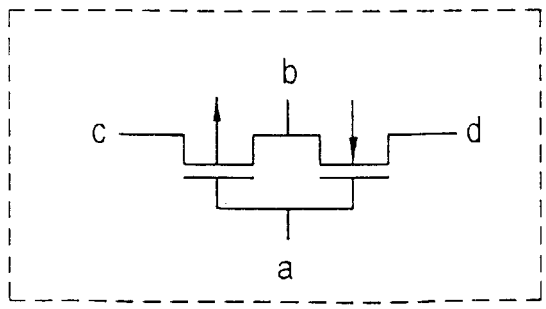

Further, respective terminal portions "a", "b", "c" and "d" respectively correspond to terminal portions "a", "b", "c" and "d" of an inverter circuit shown by FIG. 14C.

Next, FIG. 14B shows an example in the case where semiconductor layers for constituting drain regions in the N-type TFT and the P-type TFT are made common. Respective notations correspond to the notations explained in reference to FIG. 14A.

According to the structure of FIG. 14B, TFTs can be formed at a very high density which is very effective in the case of highly integrating a circuit or the like. Although PN junctions are formed in semiconductor layers which are made common, no problem is posed.

[Embodiment 11]

In this embodiment, there will be shown an example in the case where in a procedure of fabricating TFTs and CMOS circuits having the constitutions of Embodiments 1–6, lamp annealing is used as means for carrying out heating treatment.

As lamp annealing, a heat treatment by RTA (Rapid Thermal Anneal) is known. This is a technology of carrying out a heating treatment at high temperatures in a short period of time (several seconds through several tens seconds) by irradiating strong beam from an infrared lamp in which the throughput is very excellent. Further, other than infrared ray, ultraviolet ray may be used auxiliarily.

According to the present invention, a heating treatment is carried out in a step of crystallizing an amorphous semiconductor film, a step of improving crystalline performance of a crystalline semiconductor film, a step of gettering a catalyst element, a step of activating an impurity for controlling a threshold value or the like. In such a case, this embodiment can be utilized.

Further, the constitution of the embodiment and the constitutions of the other embodiments can freely be combined.

[Embodiment 12]

In this embodiment, an explanation will be given of the case in which a catalyst element is gettered by means different from that in Embodiment 1.

Although in Embodiment 1, the gettering step is carried out by utilizing only an element selected from group 15, the step of gettering a catalyst element can also be carried out in a state in which an element selected from either of group 13 and group 15 is added.

In that case, first, when a state shown by FIG. 1E is provided, only a region for constituting the N-channel type TFT is concealed by a resist mask and boron is successively added. That is, only phosphorus is present in a region for constituting the N-channel type TFT and boron and phosphorus are present in a region for constituting the P-channel type TFT.

Further, a heating treatment is carried out under the state, and a step of gettering a catalyst element is carried out. According to an experiment by the inventors, it has been confirmed that gettering effect by phosphorus plus boron is superior to gettering effect only by phosphorus. However, no gettering effect is achieved only by boron and excellent gettering effect is shown by a combination of (phosphorus) plus (boron at a high concentration than phosphorus).

Further, the constitution of the embodiment can freely be combined with the constitutions of other embodiments.

[Embodiment 13]

When a quartz substrate or a silicon substrate having excellent heat resistance is used as a substrate, it is effective to carry out a heating treatment at about 700–1100° C. in an oxidizing atmosphere including a halogen element. This is a technology of utilizing gettering effect of a metal element by the halogen element.

Further, by using the technology along with the gettering step shown in Embodiment 12, a catalyst element which has been utilized in crystallizing an amorphous silicon film can thoroughly be removed. In this way, when the catalyst element is thoroughly removed at least from a channel forming region, highly reliable semiconductor device can be provided.

[Embodiment 14]

In this embodiment, TFT explained in Embodiments 1–5 is applied to a pixel TFT of a pixel matrix circuit and in this case, TFT is provided with a structure in which the offset structure and the overlap structure shown by Embodiment 5 are compounded.

Figure 15:
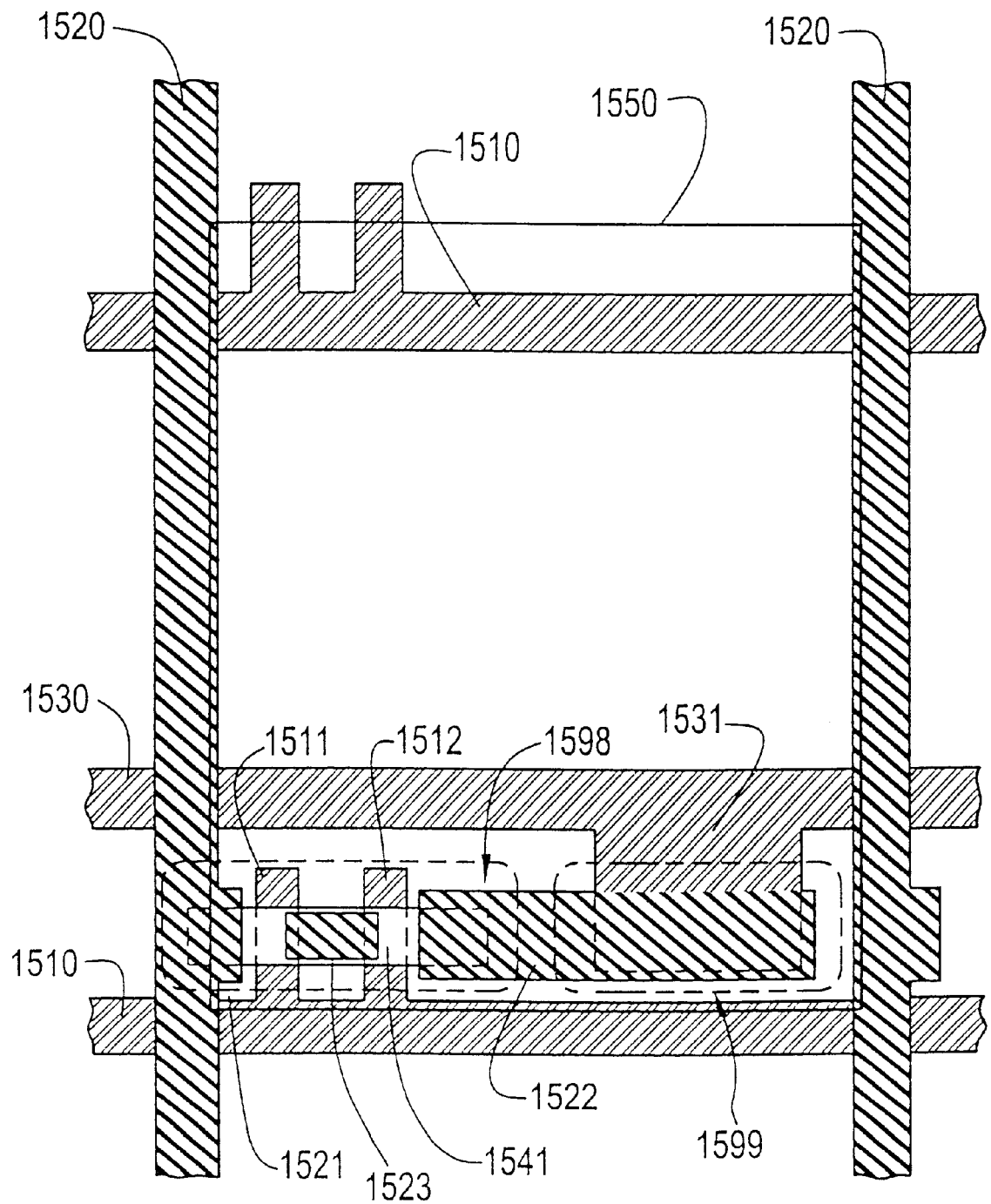
FIG. 15 is a plane view of a pixel in a pixel matrix circuit of Embodiment 14.
Figure 16:
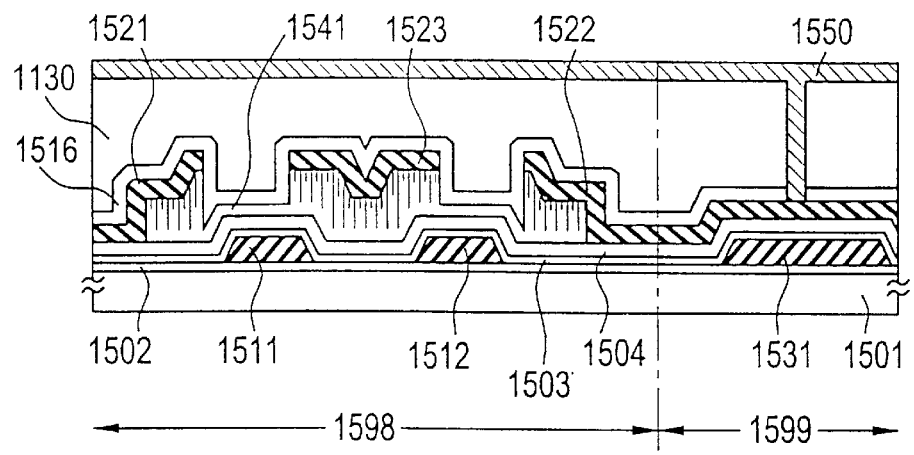
FIG. 16 is a sectional view of a pixel in a pixel matrix circuit of Embodiment 14.

FIG. 15 is a schematic plane view of one pixel in a pixel matrix circuit and FIG. 16 is a sectional view thereof. Each pixel of the pixel matrix circuit is formed with a pixel TFT 1598 and a storage capacitance 1599. The pixel matrix circuit is arranged with a plurality of gate wirings 1510 for inputting signals for controlling ON/OFF of the pixel TFT 1598 in parallel with X direction and arranged with a plurality of source wirings 1520 for inputting image signals in parallel with Y direction.

The fabrication steps of the pixel matrix circuit are similar to those in Embodiment 1 and therefore, an explanation of the fabrication steps of the embodiment will be simplified. A base film 1502 comprising a silicon oxide film is formed on the surface of a glass substrate 1501. On the base film 1502, as a first layer of wirings, the gate wirings 1510 and a capacitance wiring 1530 in parallel with the gate wirings 1510 are formed. As a conductive film for constituting the first layer of wirings, a laminated layer film comprising a TaN film at a lower layer and Ta film at an upper layer is used. The gate wiring 1510 is integrally formed with gate electrodes 1511, 1512 of TFT and the capacitance wiring 1530 is integrally formed with a capacitance electrode 1531 for constituting a lower electrode of the storage capacitance 1599.

A gate insulating layer comprising a silicon nitride film 1503 and a silicon nitroxide film 1504 is formed above wirings and electrodes on the first layer. A semiconductor layer 1541 of the pixel TFT 1598 is formed above the insulating layers 1503 and 1504. In this embodiment, a reduction in leakage current is achieved by constituting a so-called multi gate type in which the pixel TFT is constituted by TFT having the gate electrode 1511 and TFT having the gate electrode 1512 which are connected in series.

As wirings at a second layer, the source wirings 1520, a source electrode 1521, a drain electrode 1522 and a mask electrode 1523 comprising a laminated layer film of Ti/Al/Ti are formed. The source electrode 1521 is integrally formed with the source wiring 1520. The source wirings 1520 are arranged to constitute a lattice along with the gate wirings 1510 and the capacitance wiring 1530 and are insulated from the wirings 1510 and 1530 by the gate insulating layer.

Therefore, in order to reduce parasitic capacitance between the first layer wirings 1510 and 1530 and the second layer wirings 1520, the thickness of the gate insulating layer is made thicker than that of a top gate type TFT. In this case, the thickness is set to 0.3–0.8 $\mu$m, representatively, 0.4–0.5 $\mu$m. Therefore, the thickness of the silicon nitride film 1503 of the first layer constituting the gate insulating layer is set to 0–500 nm, representatively, 25–300 nm. The thickness of the silicon nitroxide film (or silicon oxide film) at the second layer is set to 0–800 nm, representatively, 150–500 nm. In this case, the thickness of the silicon nitride film 1503 is set to 150 nm and the thickness of the silicon oxynitride film 1504 is set to 300 nm.

Channel etching is carried out on the semiconductor layer 1541 of the pixel TFT 1598 with the electrodes 1521, 1522 and 1523 at the second layer as masks. The potential of the mask electrode 1523 is floated, the function of applying voltage on the semiconductor layer 1541 is dispensed with and it functions as the mask in the channel etching step. In this case, the source electrode 1521 and the drain electrode 1522 are offset relative to the gate electrodes 1511 and 1512 and in the meantime, the mask electrode 1523 is formed to overlap the gate electrodes 1511 and 1512.

According to the structure, HRD of offset type explained in Embodiment 1 is formed at the source region and the drain region and a measure for high withstand voltage is carried out. In the meantime, an impurity region at a layer below the mask electrode 1523 corresponds to a portion connecting two TFTs and functions only as a path of carriers and accordingly, the high mobility is the most predominant. Accordingly, an HRD region of overlap type explained in Embodiment 3 is provided at the impurity region and promotion of mobility is achieved.

Further, in a pixel matrix circuit, voltage is applied to a pixel electrode such that the polarity is alternately reverted and accordingly, it is preferable that the characteristic of the pixel TFT 1598 is equalized in respect of voltage having both positive and negative polarities. In this embodiment, it is designed such that lengths of offset regions formed at the source region and the drain region are equalized and lengths of overlap regions formed at both sides of the mask electrode 1523 are equalized.

As shown by Embodiments 1–3, the length of offset and the length of overlap are determined by patterns of wirings at a first layer and a second layer and the lengths can respectively be set to 0.3–3 $\mu$m. In this case, the length of offset and the length of overlap are respectively set to 1 $\mu$m. Further, in the case of the pixel TFT 1598, the channel width and the channel length are set to 1–10 $\mu$m. In this case, the channel width is set to 5 $\mu$m and the channel length is set to 3 $\mu$m. To set the channel length to 3 $\mu$m, widths of the gate electrodes 1511 and 1512 are set to 3 $\mu$m. Further, the lengths of overlap at both sides of the mask electrode 1523 may be set to null as shown by Embodiment 4.

The mask electrode 1523 is arranged to overlap the gate electrodes 1511 and 1512 and therefore, the mask electrode 1523 is made narrower than a width of the semiconductor layer 1541 to reduce parasitic capacitance between the mask electrode 1523 and the gate electrodes 1511 and 1512.

Meanwhile, according to the storage capacitance 1599, the drain electrode 1522 is formed to be opposed to the capacitance electrode 1531. By this structure, the storage capacitance 1599 is formed with the drain electrode 1522 and the capacitor electrode 1531 as opposed electrodes and the gate insulating layer 1503 and 1504 as a dielectric body. As shown by Embodiment 1, the pixel TFT 1598 can be constituted by four sheets of masks and further, it is apparent that even when the storage capacitance 1599 is added, only the mask pattern is changed and a number of masks is not increased. This signifies that the throughput and the yield are surprisingly promoted considering the fact that in fabricating a conventional channel stop type TFT, six sheets of masks are needed.

A protective film 1516 comprising silicon nitroxide or silicon nitride having a thickness of 100–250 nm is formed to cover the pixel TFT 1598 and the storage capacitance 1599. In this case, a silicon nitroxide film having a thickness of 200 nm is formed.

On top of the protective film 1516, an interlayer insulating film 1130 having a thickness of 0.8–1.5 $\mu$m for constituting a base of a pixel electrode 1550 is formed. As the interlayer insulating film 1130, a coated film providing flat surface is preferable. As one of the coated film, a resin film of polyimide, polyamide, polyimideamide, acrylic resin or the like or a coated film of silicon oxide-base of PSG, silicon oxide or the like can be used. In this embodiment, as the interlayer insulating film 1130, an acrylic resin film is formed with a thickness of 1.0 $\mu$m.

Further, a contact hole reaching the drain electrode 1522 is formed in the interlayer insulating film 1530 and the protective film 1517. At this stage, a number of masks is 5. Next, an ITO (Indium Tin Oxide) film having a thickness of 100–150 nm is formed as a transparent conductive film. In this case, the ITO film is formed with a thickness of 120 nm and patterned to thereby form the pixel electrode 1550. At this stage, the number of masks is 6. By the above-described steps, the pixel matrix circuit is completed. Further, a reflection electrode may be fabricated by constituting the material of the pixel electrode 1550 by a metal film of Al or the like.

Although the dielectric body of the storage capacitance 1599 is constituted by two layers of insulators of the silicon nitride film 1503 and the silicon nitroxide film (silicon oxide film) 1504, only the lower layer of the silicon nitride film 1503 may be used. In this case, after patterning the island-like semiconductor layer shown by FIG. 2B, the silicon nitroxide film 1504 exposed with the semiconductor layer as a mask is removed by etching and the source wirings 1520 and the electrodes 1521, 1522 and 1523 constituting the second layer wirings are thereafter formed. However, in etching the silicon nitroxide film 1504, an etching gas or an etchant whereby the silicon nitride film 1503 functions as an etching stopper needs to use. Further, it is also effective that in order to make the silicon nitroxide film 1504 easy to etch, the composition is adjusted and a silicon oxide film is formed in place of the silicon nitroxide film.

As has been explained in Embodiments 5 and 9, a pixel TFT comprising an n-channel type and an inverter circuit comprising CMOS TFT can simultaneously be formed. By using the technology, although not illustrated, a peripheral drive circuit for driving the pixel matrix circuit is also formed on the same substrate 1501. According to TFT arranged in the peripheral drive circuit, high speed operation is predominant and accordingly, it is preferable to render source and drain regions an overlap structure.

Although the pixel TFT of the embodiment is constituted by a multi gate type having two gate electrodes, a number of the gate electrodes is not limited to 2 but can be made 1 or 2 or more. It is preferable that in any number of the gate electrodes, source and drain regions which are applied with voltage by the source wiring 1520 and the pixel electrode 1550 are provided with an offset structure and a measure for high withstand voltage is carried out. Further, in the case where the number of gates is 2 or more, impurity regions other than the source and drain regions are formed in the semiconductor layer, it is preferable that the impurity regions are made to overlap the gate electrodes or the offset length and the overlap length become null as shown by Embodiment 3 whereby the high mobility becomes predominant.

[Embodiment 15]

Figure 17:
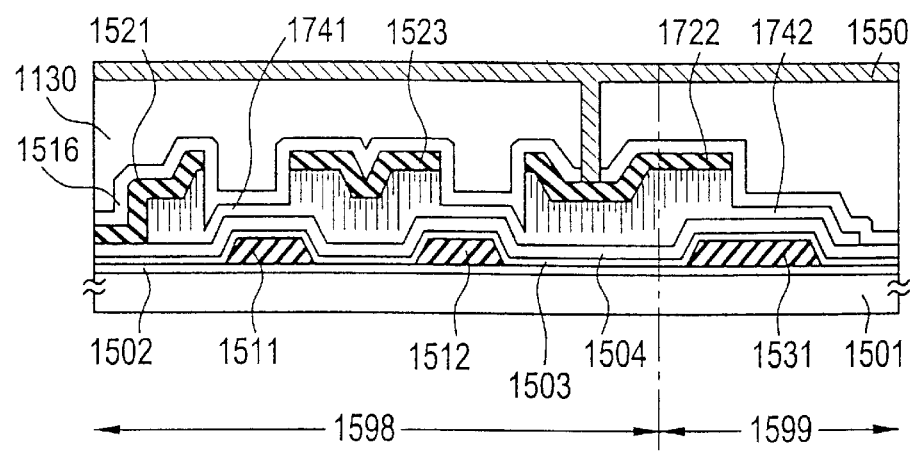
FIG. 17 is a sectional view of a pixel in a pixel matrix circuit of Embodiment 15.

The embodiment shows a modified example of the storage capacitance of Embodiment 14. FIG. 17 shows a sectional view of a pixel matrix circuit according to the embodiment. Further, in FIG. 17, notations the same as those in FIGS. 15 and 16 designate constituent elements the same as those in Embodiment 14 and patterns of a semiconductor layer 1741 and a drain electrode 1722 of a pixel TFT are different from those in Embodiment 14.

In this embodiment, the island-like semiconductor layer shown by FIG. 2B is formed such that the semiconductor layer is opposed to the capacitance electrode 1531. Further, the drain electrode 1722 is formed to partially overlap the capacitance electrode 1531. Channel etching is carried out on the island-like semiconductor layer with the electrode 1521, 1523 and 1722 as masks. As a result, the semiconductor layer 1741 is formed with an i-type region 1742 comprising an intrinsic or substantially intrinsic i layer above the capacitance electrode 1531. The i-type region 1742 is provided with a film thickness substantially the same as the channel forming region of the pixel TFT and is provided with similar function.

When voltage is applied by the capacitance electrode 1531, a channel is formed in the i-type region 1742. Further, a channel is formed also at an i layer of the semiconductor layer 1741 where the drain electrode 1722 and the capacitance electrode 1531 overlap, that is, the mask overlap region of FIG. 8C. These channels function as upper electrodes of the storage capacitance. The connection structure of the upper electrode of the storage capacitance and the pixel electrode 1550 are the same as the connection structure of the channel forming region and the drain electrode illustrated by FIG. 8C. In reference to FIG. 8, the i-type region 1742(803) comprising the i layer, a mask overlap region (804), an LDD region (805) comprising an n⁻ layer, an n⁺ layer (806), the drain electrode 1722(802) and the pixel electrode 1550 are arranged in this order.

In this case, it is preferable to set the length of the mask overlap region such that the principal part of the upper electrode of the storage capacitance is constituted by the i-type region 1742 and the length is set to about 0.3–3 $\mu$m. Further, the drain electrode 1722 and the capacitance electrode 1531 are provided with the overlap structure to reduce resistance between the pixel electrode 1550 and the upper electrode of the storage capacitance. Further, in order to form a channel by low voltage by using the i-type region 1742, it is preferable to carry out the measure for controlling the threshold value shown by Embodiment 8.

[Embodiment 16]

Figure 18:
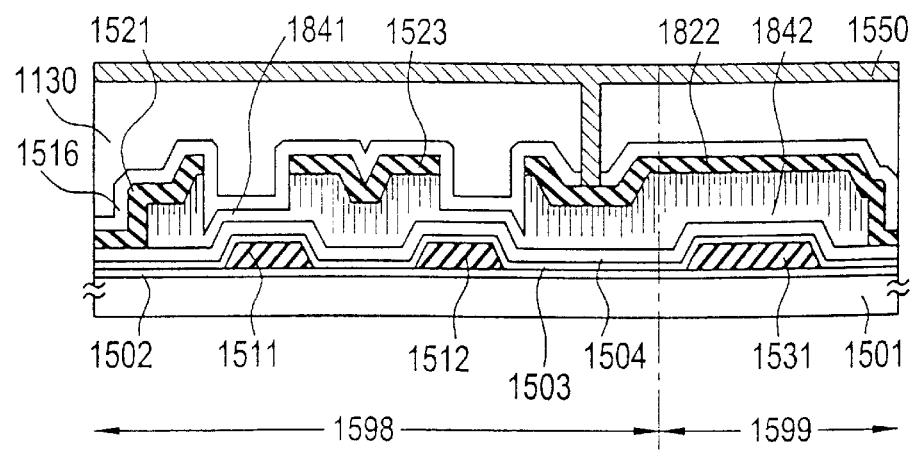
FIG. 18 is a sectional view of a pixel in a pixel matrix circuit of Embodiment 16.

FIG. 18 shows a sectional view of a pixel matrix circuit according to this embodiment. Similar to Embodiment 15, this embodiment shows an example in which an i layer of a semiconductor layer of a pixel TFT is used for an upper electrode of a storage capacitance. Further, in FIG. 18, notations the same as those in FIG. 17 designate constituent elements the same as those in Embodiment 15. Patterns of a semiconductor layer 1842 and a drain electrode 1822 of the pixel TFT differ from those in Embodiment 15.

Although in Embodiment 15, channel etching is carried out on the semiconductor layer 1741 opposed to the capacitance electrode 1531, in this embodiment, the channel etching is not carried out on a semiconductor layer 1841 opposed to the capacitance electrode. Therefore, the drain electrode 1822 is formed to cover the surface of a semiconductor layer 1842 opposed to the capacitance electrode 1531.

According to the structure, the upper electrode of the storage capacitance constitutes a channel formed in an i layer of the semiconductor layer 1842 by voltage of the capacitance electrode 1531. The region where the channel is formed corresponds to the overlap region 804 (refer to FIG. 8C) explained in Embodiment 3. Accordingly, with regard to the connection structure between the upper electrode of the storage capacitance and the pixel electrode 1550, in reference to FIG. 8C, a mask overlap region comprising the i layer (804), an LDD region comprising an n⁻ layer (805), an n⁺ layer (806), the drain electrode 1822(802) and the pixel electrode 1550 are arranged in this order.

In order to form the channel at low voltage by the storage capacitance and the i layer (mask overlap region) of the semiconductor layer 1841 for constituting the upper electrode, the threshold value control shown by Embodiment 8 is preferably carried out as a measure therefor.

[Embodiment 17]

Figure 19A:
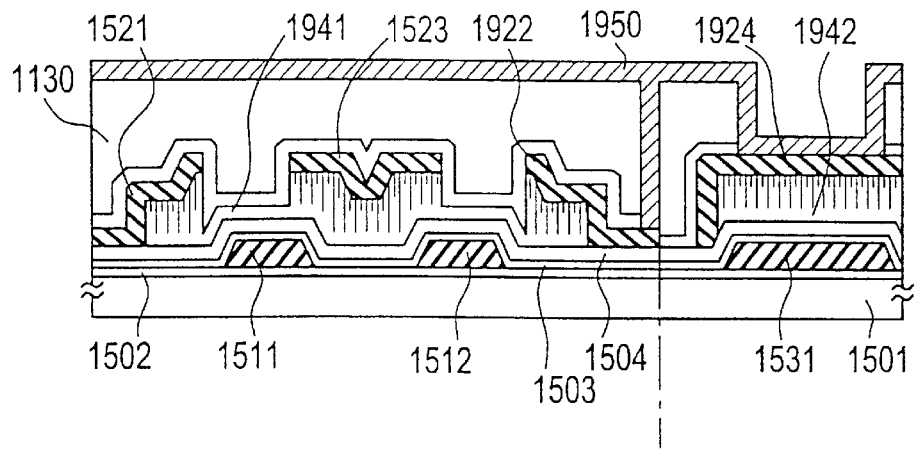
FIGS. 19A and 19B are sectional views of a pixel in a pixel matrix circuit of Embodiment 17.
Figure 19B:
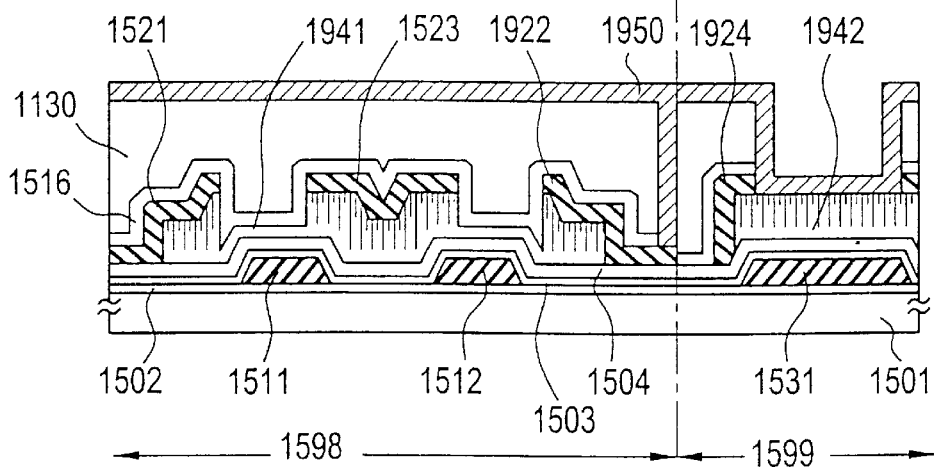

FIGS. 19A and 19B are sectional views of pixel matrix circuits according to the embodiment. This embodiment is a modified example of Embodiment 16. In FIGS. 19A and 19B, notations the same as those in FIG. 18 designate constituent elements the same as those in Embodiment 16 and what are different from Embodiment 16 resides in patterns of a semiconductor layer 1941 and a drain electrode 1922 and the connection structure of a pixel electrode 1950 in a pixel TFT and in that a semiconductor layer 1942 and a second layer of an electrode 1924 are formed in a storage capacitance separately from the pixel TFT.

According to the embodiment, in the step of patterning the island-like semiconductor layer shown by FIG. 2B, an island-like region for constituting a prototype of the semiconductor layer 1941 of the pixel TFT and the semiconductor layer 1942 of the storage capacitance are formed. Next, the second layer of the wiring source electrode 1522, the mask electrode 1523, the drain electrode 1922 and the electrode 1924 are formed. The electrode 1924 covers the semiconductor layer 1942 such that the semiconductor layer 1942 of the storage capacitance is not subjected to channel etching. By carrying out channel etching, the semiconductor layer 1941 of the pixel TFT is formed.

Next, the protective film 1516 and the interlayer insulating film 1530 are formed. After forming contact holes reaching the drain electrode 1922 and the electrode 1924 of the storage capacitance in the protective film 1516 and the interlayer insulating film 1130, the pixel electrode 1950 is formed. As shown by FIG. 19A, the pixel electrode 1950 is electrically connected to the drain electrode 1922 and the electrode 1924 of the storage capacitance.

The structure of the storage capacitance is substantially similar to that in Embodiment 16 and an upper electrode of the storage capacitance is a channel formed in an i layer of the semiconductor layer 1942. The i layer corresponds to the mask overlap region in FIG. 8C. According to the connection structure between the upper electrode of the storage capacitance and the pixel electrode 1950, a mask overlap region (804) comprising the i layer of the semiconductor layer 1942, an LDD region comprising an n⁻ layer (805), an n⁺ layer (806), the electrode 1924(802) and the pixel electrode 1950 are arranged in this order.

Further, in this embodiment, the n⁻ layer can function as an electrode. Therefore, as shown by FIG. 19B, in the step of forming the contact hole for the pixel electrode 1950, the electrode 1924 is also etched and the pixel electrode 1950 is connected to the n⁺ layer of the semiconductor layer 1942.

Further, although in FIGS. 19A and 19B, channel etching is not carried out for the semiconductor layer 1942, the stepped difference of the semiconductor layer 1942 may be alleviated by forming projected portions at side faces of the semiconductor layer 1942 as shown by Embodiment 8 such that at least portions thereof for connecting to the pixel electrode 1950 are covered.

[Embodiment 18]

Figure 20:
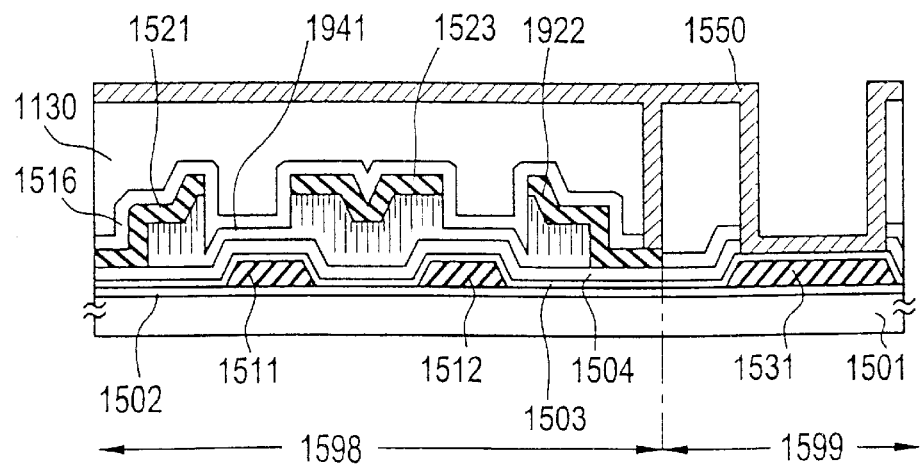
FIG. 20 is a sectional view of a pixel in a pixel matrix circuit of Embodiment 18.

FIG. 20 shows a sectional view of a pixel matrix circuit according to the embodiment. This embodiment is a modified example of Embodiment 17. In FIG. 20, notations the same as those in FIG. 19 designate constituent elements the same as those in Embodiment 17 and what are different from Embodiment 17 resides in that the semiconductor layer 1942 and the electrode 1924 of the storage capacitance of Embodiment 17 are not formed and in the connection structure of the pixel electrode 1550.

According to this embodiment, the pixel electrode 1550 constitutes an upper electrode of a storage capacitance. In the step of forming the contact hole for the pixel electrode 1550, the interlayer insulating film 1130, the protective film 1516 comprising a silicon nitroxide film and the second layer of the gate insulating layer 1504 are etched and therefore, a dielectric body of the storage capacitance is constituted by the first layer of the silicon nitride film 1503.

Further, according to the embodiment, as a dielectric body of the storage capacitance, the silicon nitride film 1503, the silicon nitroxide (oxynitride) film 1504 and the protective film 1516 can be used. For example, in forming the contact hole for the pixel electrode 1550, mask patterns of the interlayer insulating film 1130 and the protective film 1516 are made different from each other and the protective film 1516 of the contact hole of the storage capacitance is not removed by which the enumerated three films can be used for the dielectric body of the storage capacitance.

For example, when the protective film 1516 is constituted by a silicon nitride film, and in the step of forming the contact hole, an etching gas or an etchant is used such that the second layer of the silicon oxynitride film 1504 of the gate insulating layer becomes an etching stopper, the dielectric body of the storage capacitance can be constituted by the silicon nitroxide (oxynitride) film 1504 and the silicon nitride film 1503.

[Embodiment 19]

Figure 21:
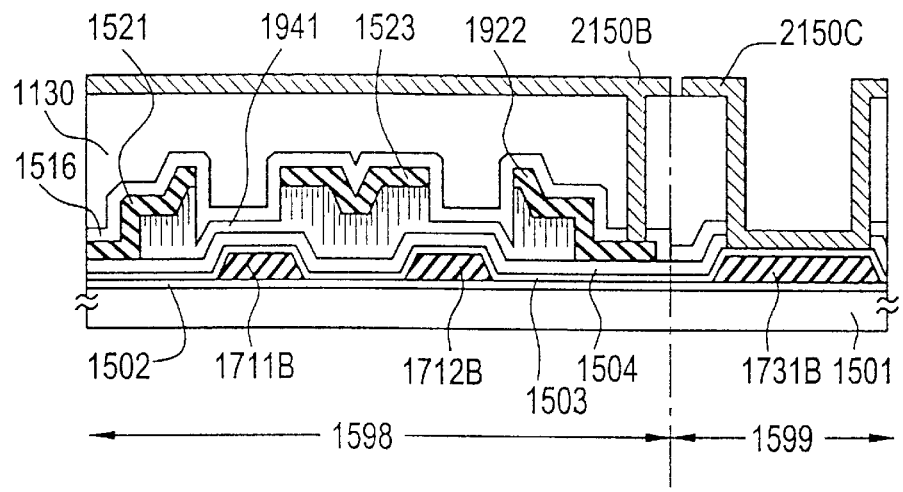
FIG. 21 is a sectional view of a pixel in a pixel matrix circuit of Embodiment 19.
Figure 23:
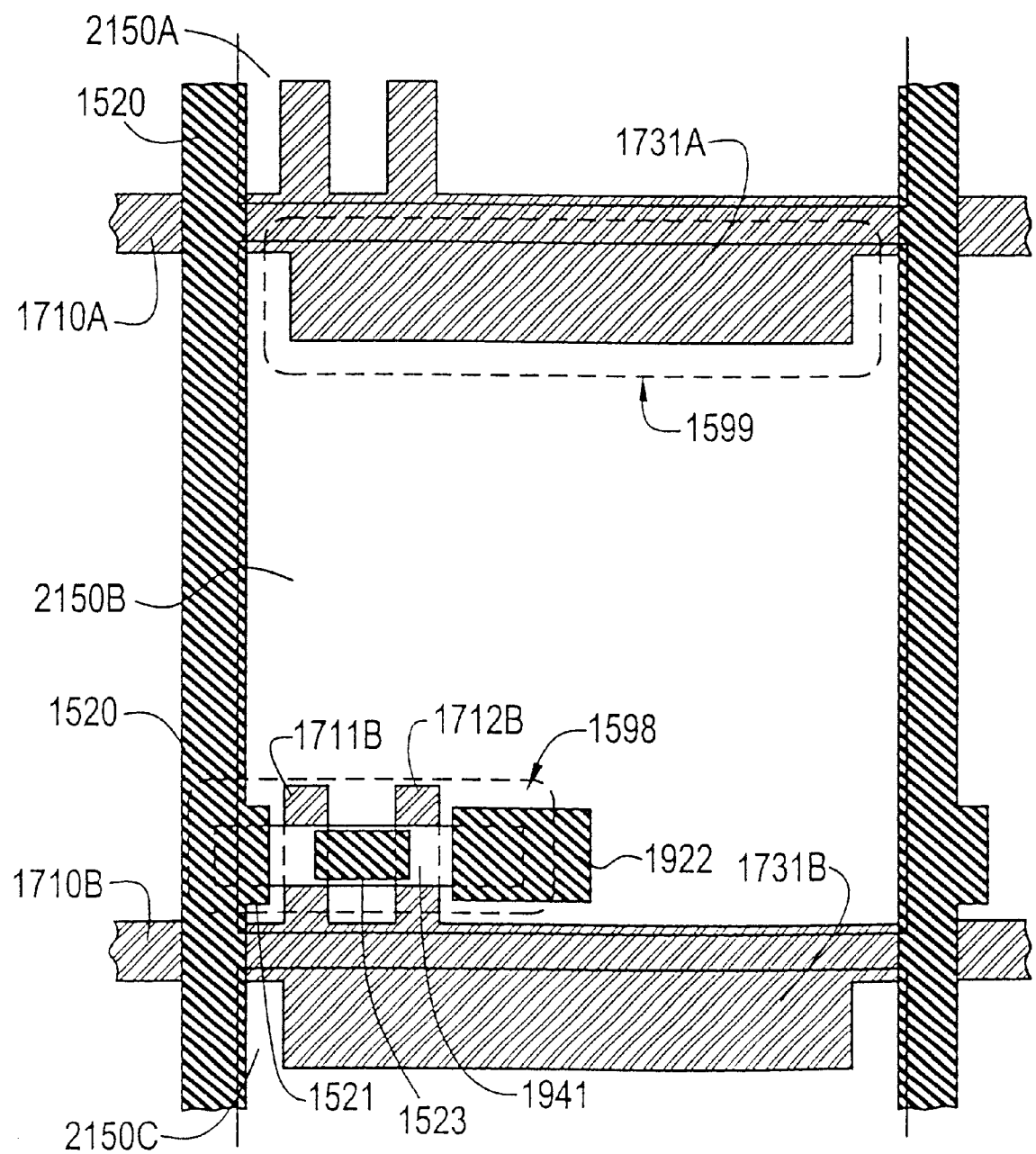
FIG. 23 is a plane view of a pixel in a pixel matrix circuit of Embodiment 19.

The embodiment is a modified example of Embodiment 18. Although in Embodiment 18, the capacitance wiring 1530 is needed as the electrode of the storage capacitance separately from the gate wiring 1510, according to this embodiment, an example of omitting the capacitance wiring will be shown. FIG. 23 shows a plane view of a pixel matrix according to the embodiment and FIG. 21 shows a schematic sectional view. In FIG. 23 and FIG. 21, notations the same as those in FIG. 23 designate the same constituent elements.

As shown by FIG. 23, a gate wiring 1710 according to the embodiment is integrally formed with gate electrodes 1711 and 1712 of a pixel TFT and an electrode 1731 of a storage capacitance. The capacitance electrode 1731 and a pixel electrode 2150 are used as electrodes of the storage capacitance similar to Embodiment 17, however, the pixel electrode 2150 is opposed to the capacitance electrode 1731 formed at a succeeding stage or a preceding stage of the gate wiring 1710.

FIG. 21 corresponds to a sectional view of a pixel having a pixel electrode 2150B. As shown by FIG. 23, the pixel electrode 2150B is opposed to the capacitance electrode 1731A formed at the gate wiring 1710A at the preceding (succeeding) stage and the storage capacitance is formed with the gate insulating layers 1503 and 1504 as a dielectric body. Further, the capacitance electrode 1731B formed at the gate wiring 1710B is opposed to the pixel electrode 2150 at the succeeding (preceding) stage.

Figure 22A:
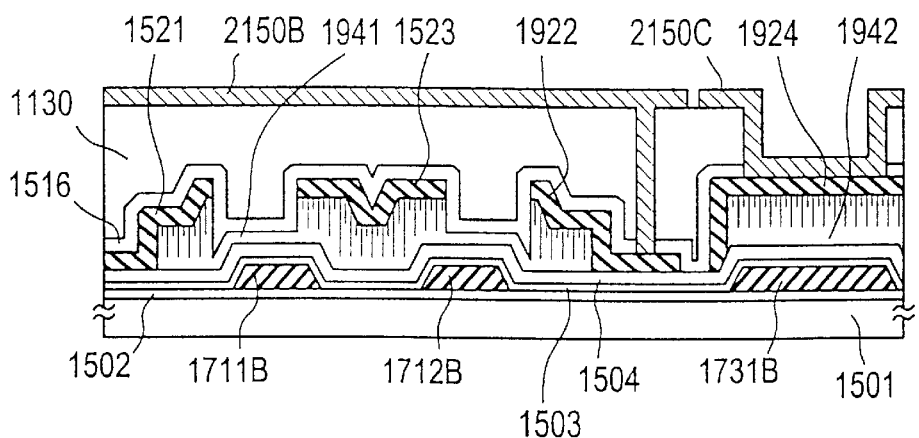
FIGS. 22A and 22B are sectional views of pixels in pixel matrix circuits of Embodiment 19.
Figure 22B:
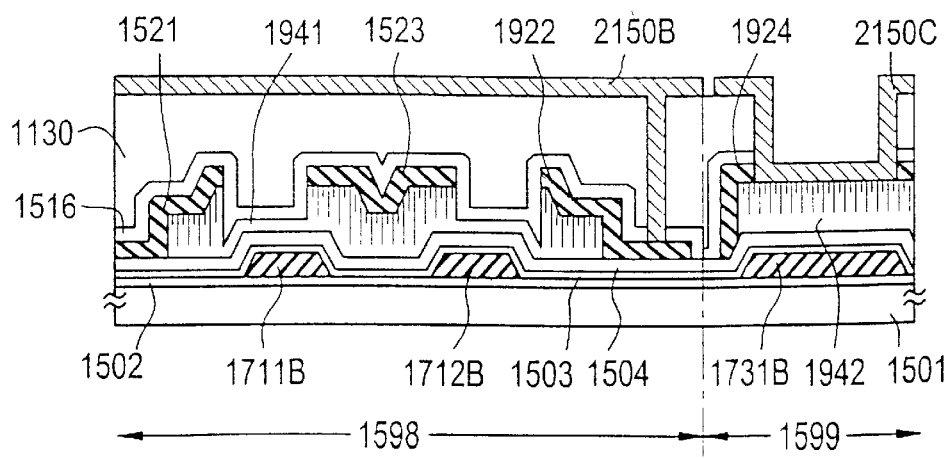

Further, the capacitance electrode 1731 according to the embodiment is applicable to a case in which a pixel electrode is provided with different portions for connecting to a drain electrode and a storage capacitance and is applicable also to Embodiment 17. FIGS. 22A and 22B show sectional views of pixel matrix circuits in the case where the embodiment is applied to Embodiment 17 (FIGS. 19A and 19B). Further, notations in FIGS. 22A and 22B are attached in reference to those in FIG. 21.

[Embodiment 20]

By forming material of the capacitance wiring and the electrodes 1530 and 1531 which are wirings of the first layer by a metal film which can be anodized, an anodic oxide film can be formed by anodizing the surface of the capacitance electrode 1531. The anodic oxide film can be used as a dielectric body of a storage capacitance.

A Ta film, a MoTa alloy film or the like can be used as a metal film which withstands the step of gettering phosphorus mentioned in Embodiment 1 and which can be anodized. A laminated film TaN/Ta used in the first layer wiring of the embodiment can be anodized.

For example, when the embodiment is applied to the pixel matrix circuits shown by FIGS. 23 and 18, in the step of forming the contact hole for the pixel electrode 1550 or 2150, by removing as far as the silicon nitride film 1503, a dielectric body of a storage capacitance can be formed only by an anodized film.

[Embodiment 21]

An explanation will be given of electronic devices having a display device of the embodiment in reference to FIGS. 24A–24F. According to this embodiment, in respect of applied products (electro-optical devices) to which a liquid crystal display device according to the embodiment is applicable, AMLCD shown by the embodiment is utilized in displays of various electronic devices. Further, electronic devices according to the embodiment indicate products mounted with AMLCD as a display device.

As electronic engineering devices to which the present invention is applied, there are pointed out a video camera, a still camera, a projector, a head mount display, a car navigation system, a personal computer, a portable information terminal (mobile computer, portable telephone) and so on.

Figure 24A:
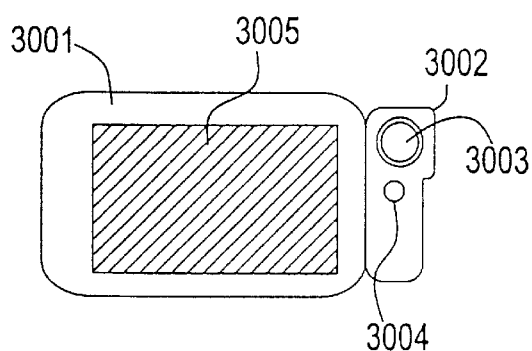
FIGS. 24A, 24B, 24C, 24D, 24E and 24F are schematic views of electronic devices having display devices of Embodiment 21.

FIG. 24A shows a mobile computer which is constituted by a main body 3001, a camera unit 3002, an image receiving unit 3003, an operation switch 3004 and a display device 3005. The present invention is applied to the display device 3005.

Figure 24B:
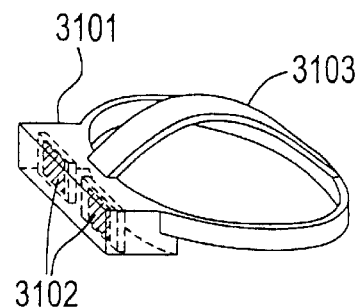

FIG. 24B shows a head mount display which is constituted by a main body 3101, a display device 3102 and a band unit 3103. The present invention is applicable to the display device 3102.

Figure 24C:
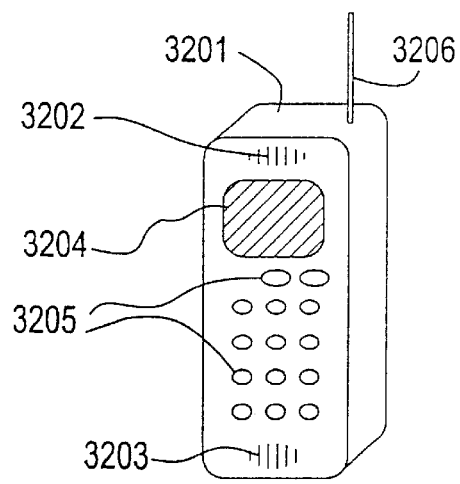

FIG. 24C shows a portable telephone which is constituted by a main body 3201, a voice outputting unit 3202, a voice inputting unit 3203, a display device 3204, operation switches 3205 and an antenna 3206. The present invention is applied to the display device 3204.

Figure 24D:
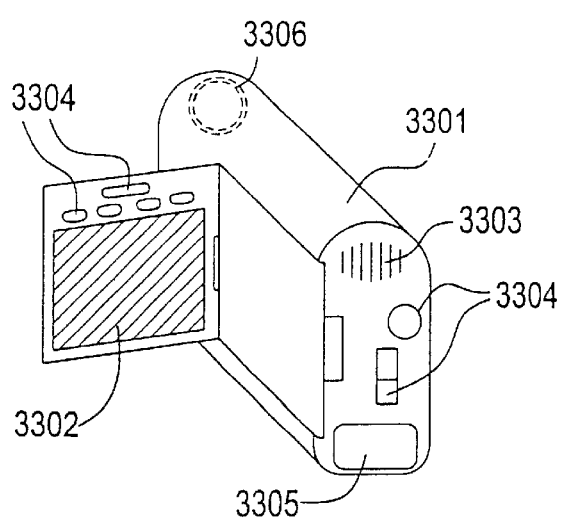

FIG. 24D shows a video camera which is constituted by a main body 3301, a display device 3302, a voice inputting unit 3303, operation switches 3304, a battery 3305 and an image receiving unit 3306. The present invention is applied to the display device 3302.

Figure 24E:
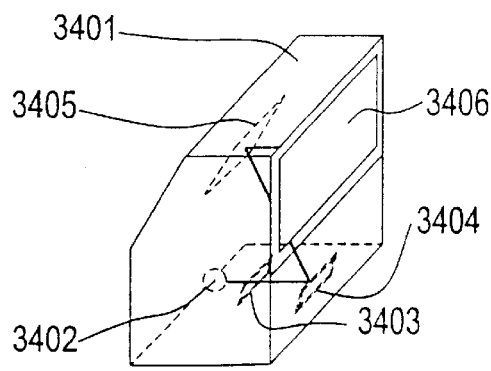

FIG. 24E shows a rear type projector which is constituted by a main body 3401, a light source 3402, a display device 3403, a polarized beam splitter 3404, reflectors 3405 and 3406 and a screen 3407. The present invention is applied to the display device 3403.

Figure 24F:
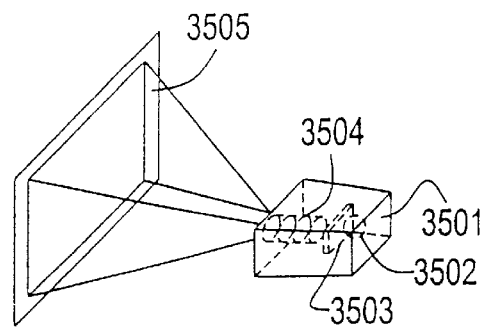

FIG. 24F shows a front type projector which is constituted by a main body 3501, a light source 3502, a display device 3503, an optical system 3504 and a screen 3505. The present invention is applied to the display device 3502.

As mentioned above, the application range of the present invention is extremely wide and the present invention is applicable to electronic devices mounted with display devices in all the fields. Further, the present invention is applicable to an electric light display board or a display device for advertisement.

[Embodiment 22]

This embodiment shows an example in which at the formation steps of the gate insulating film and the semiconductor film (amorphous silicon film) in the manufacturing steps of each Embodiment 1 to Embodiment 21, the respective films are continuously formed without being exposed to the atmosphere.

As a method of forming the gate insulating film and the semiconductor film, any method such as plasma CVD method and sputtering method can be employed. However, it is important to prevent contamination materials of the atmosphere (oxygen, boron, metal elements or the like) from attaching to the interface between the gate insulating film and the semiconductor film by avoiding exposure of the films to the atmosphere. In this embodiment, a multi-chamber (for instance, a device shown in FIG. 25) that is provided with an exclusive chamber for forming the gate insulating film and an exclusive chamber for forming starting semiconductor film, is used, and by moving each chamber, the gate insulating film and the semiconductor film are continuously formed so as to form a lamination without being exposed to the atmosphere. Incidentally, it is preferable to reduce the contamination material on the surface, where the semiconductor film is to be formed, by means of active hydrogen or hydrogen compounds before forming the semiconductor film.

Figure 25:
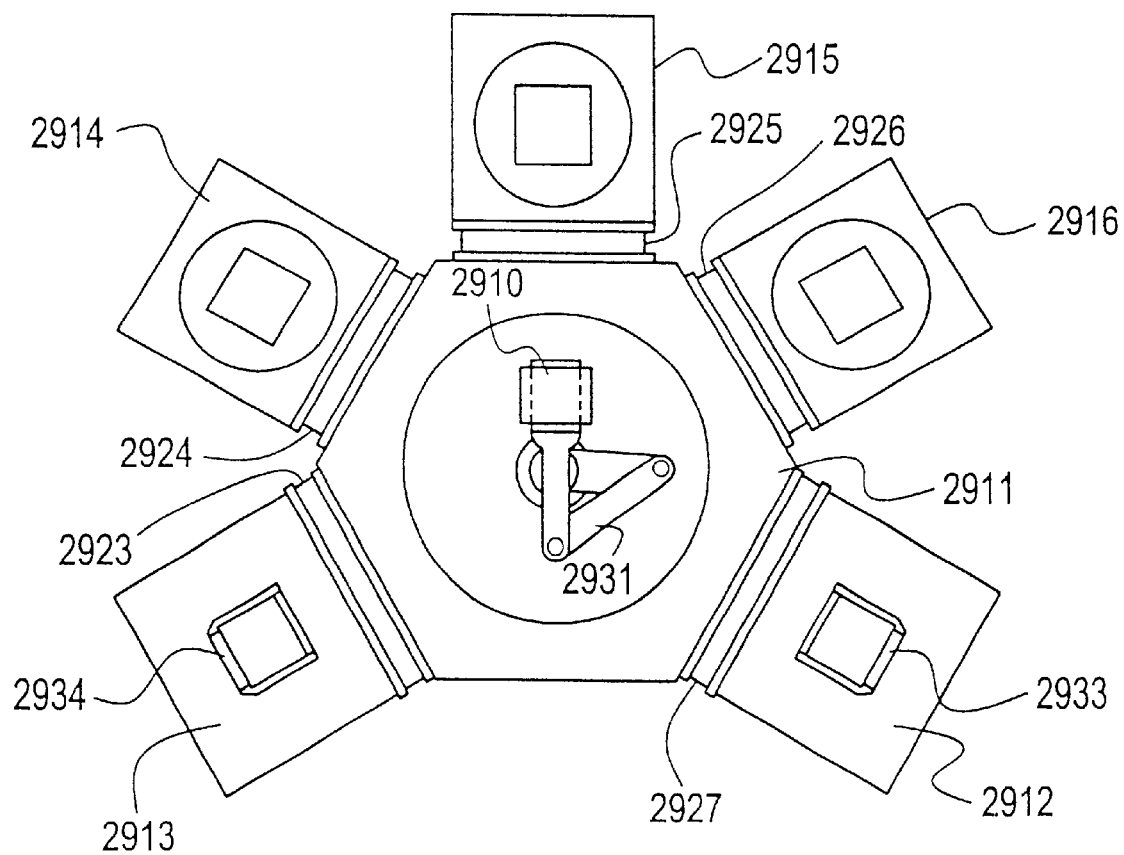
FIG. 25 is a view showing the structure of a multi-chamber of Embodiment 22.

FIG. 25 schematically shows a device (a continuous film formation system) viewed from the top thereof, which will be described in this embodiment. In FIG. 25, reference numerals 2912–2916 denote chambers having air-tight property. A vacuum discharge pump and an inert gas introducing system are arranged in each chamber.

The present embodiment is applied to the cases in which the gate insulating film and the semiconductor film of Embodiment 1 or Embodiment 2 are formed.

Chambers denoted by 2912 and 2913 serve as load-lock chambers for carrying a sample (substrate to be processed) 2910 into the system. Reference numeral 2914 denotes a first chamber for forming the gate insulating film (a first layer). Numeral 2915 denotes a second chamber for forming the gate insulating film (a second layer). Numeral 2916 denotes a third chamber for forming the semiconductor film (amorphous silicon film). Also, numeral 2911 denotes a common chamber of the sample, which is disposed commonly to each chamber. Reference numerals 2923–2927 denote gate valves of each chamber; 2931, a robot arm; 2933 and 2934, cassettes. In this embodiment, the case in which the gate insulating film has a double-layer structure is shown. It is needless to say, however, that the present embodiment is also applicable to a case in which the gate insulating film has a single-layer structure, and for example, to the case in which the gate insulating film is consisted from silicon oxide only.

In this embodiment, in order to prevent the contamination, the gate insulating film and the semiconductor film are formed so as to form a lamination by different chambers from each other utilizing the device shown in FIG. 25. It is a matter of course that the device shown in FIG. 25 is just an example.

Also, an arrangement is applicable in which a lamination is carried out by changing reaction gases within a single chamber. When serial film formation is conducted within the single chamber, it is preferable to reduce the contamination material, in particular, oxygen (because oxygen inhibits the crystallization) on the surface, where the semiconductor film is to be formed, by means of the active hydrogen or hydrogen compounds before forming the semiconductor film. In this case, degassing is carried out by changing oxygen attached to an inner wall of the chamber and electrodes into OH group by utilizing active hydrogen or hydrogen compounds which are generated from plasma process that uses a reaction gas such as hydrogen/$NH_3$, $H_2$, Ar and He. Accordingly, oxygen is prevented from mixing in upon the formation of the semiconductor film at the initial stage. Further, at the formation of each film, the same temperature (±50° C.) and the same pressure (±20%) are preferably used.

With the above arrangement, contamination of the gate insulating film and the semiconductor film is prevented to thereby realize stable and good electrical characteristics.

By carrying out the present invention, a semiconductor device having high mass production performance can be fabricated by a very small number of masks (typically four sheets).

Further, an electric field alleviating layer (LDD region, mask offset region, thickness offset region or the like) having a small dispersion in properties can be formed between a channel forming region and a source or drain electrode and accordingly, a semiconductor device having high reliability and high reproducibility can be realized.

What is claimed is:

1. An electric device including a display device, said display device comprising:
    a plurality of gate wirings;
    a plurality of source wirings;
    a plurality of pixels each being located at an intersection of each of the plurality of gate wirings and each of the plurality of source wirings;
    at least a bottom gate type thin film transistor in each of the plurality of pixels;
    at least a storage capacitor connected to a pixel electrode; and
    a first crystalline semiconductor film of the thin film transistor, said first crystalline semiconductor film including a source region, a drain region and at least one channel forming region therein,
    wherein each of the source region and the drain region in the first crystalline semiconductor film includes toward a gate insulating film,
    at least a first conductive layer,
    at least a second conductive layer having a higher resistance than the first conductive layer, and
    at least a first semiconductor layer having a same conductive type as the channel forming region,
    wherein a concentration profile of an impurity to give a conductivity to the first and the second conductive layers is varied continuously from the first conductive layer to the second conductive layer, and
    wherein the storage capacitor comprises,
        a first electrode comprising a same conductive film as the gate wiring,
        a dielectric body in contact with the first electrode, and
        a second electrode comprising a second semiconductor layer being in contact with the dielectric body and having a same conductive type as the channel forming region,
    wherein the electric device is one selected from the group consisting of a mobile computer, a head mount display, a portable telephone, a video camera, a still camera, a personal computer, a rear type projector, and a front type projector.

2. The device according to claim 1,
    wherein the second semiconductor layer is formed in the first crystalline semiconductor film of the thin film transistor.

3. The device according to claim 1,
    wherein the second semiconductor layer includes a region having a film thickness same as a film thickness of the channel forming region.

4. The device according to claim 1,
wherein a film thickness of the second semiconductor layer is equal to a film thickness of the first semiconductor layer.

5. The device according to claim 1,
wherein an impurity selected from group 13 or group 15 to control a threshold voltage is added to the second semiconductor layer at a concentration in the range of $1 \times 10^{15} - 5 \times 10^{17}$ atoms/cm$^3$.

6. The device according claim 1, further comprising:
a third semiconductor layer in contact with the second semiconductor layer; and
a fourth semiconductor layer in contact with the third semiconductor layer,
wherein a concentration profile of an impurity to give a conductivity from the fourth semiconductor layer to the third semiconductor layer is substantially equal to the concentration profile of the first and second conductive layers,
wherein the second, third and fourth semiconductor layers are formed in a second crystalline semiconductor film.

7. The device according to claim 6,
wherein the fourth semiconductor layer is connected to a drain electrode of the thin film transistor.

8. The device according to claim 6,
wherein the fourth semiconductor layer is connected to the pixel electrode.

9. The device according to claim 1,
wherein the impurity to give a conductivity to the first and second conductive layers is an element selected from group 13 or group 15.

10. The device according to claim 1,
wherein the first crystalline semiconductor film includes at least an element selected from the group consisting of Ni, Ge, Pt, Co, Fe, Au, Pd, Pb and Cu.

11. The device according to claim 10,
wherein a concentration of the element in the channel forming region is $5 \times 10^{17}$ atoms/cm$^3$ or lower.

12. An electric device including a display device, said display device comprising:
a plurality of gate wirings;
a plurality of source wirings;
a plurality of pixels each being located at an intersection of each of the plurality of gate wirings and each of the plurality of source wirings;
at least a bottom gate type thin film transistor in each of the plurality of pixels;
at least a storage capacitor connected to a pixel electrode; and
a first crystalline semiconductor film of the thin film transistor, said first crystalline semiconductor film including a source region, a drain region, and at least one channel forming region therein,
wherein each of the source region and the drain region in the first crystalline semiconductor film includes toward a gate insulating film,
at least a first conductive layer,
at least a second conductive layer having a higher resistance than the first conductive layer, and
at least a first semiconductor layer having a same conductive type as the channel forming region,
wherein a concentration profile of an impurity to give a conductivity to the first and the second conductive layers is varied continuously from the first conductive layer to the second conductive layer, and
wherein the storage capacitor comprises,
a first electrode of the capacitor comprising a first conductive film common to the gate wiring,
a dielectric body in contact with the first electrode,
a second electrode being in contact with the dielectric body and comprising a second conductive film common to the source wiring,
wherein the electric device is one selected from the group consisting of a mobile computer, a head mount display, a portable telephone, a video camera, a still camera, a personal computer, a rear type projector, and a front type projector.

13. The device according to claim 12,
wherein the second electrode of the storage capacitor is integrally formed with a drain electrode of the thin film transistor.

14. The device according to claim 12,
wherein an impurity to give a conductivity to the first and the second conductive layers is an element selected from group 13 or group 15.

15. The device according to claim 12,
wherein an impurity selected from group 13 or group 15 to control the threshold voltage is added to at least the channel forming region at a concentration in the range of $1 \times 10^{15} - 5 \times 10^{17}$ atoms/cm$^3$.

16. The device according to claim 12,
wherein the first crystalline semiconductor film includes at least an element selected from the group consisting of Ni, Ge, Pt, Co, Fe, Au, Pd, Pb and Cu.

17. The device according to claim 16,
wherein a concentration of the element in the channel forming region is $5 \times 10^{17}$ atoms/cm$^3$ or lower.

18. An electric device including a display device, said display device comprising:
a plurality of gate wirings;
a plurality of source wirings;
a plurality of pixels each being located at an intersection of each of the plurality of gate wirings and each of the plurality of source wirings;
at least a bottom gate type thin film transistor in each of the plurality of pixels;
at least a storage capacitor connected to a pixel electrode; and
a first crystalline semiconductor film of the thin film transistor, said first crystalline semiconductor film including a source region, a drain region, and at least one channel forming region therein;
wherein each of the source region and the drain region in the first crystalline semiconductor film includes toward a gate insulating film,
at least a first conductive layer,
at least a second conductive layer having a higher resistance than the first conductive layer, and
at least a first semiconductor layer having a same conductive type as the channel forming region;
wherein a concentration profile of an impurity to give a conductivity to the first and the second conductive layers is varied continuously from the first conductive layer to the second conductive layer,
wherein the storage capacitor comprises,
a first electrode comprising a first conductive film common to the gate wiring, a dielectric body in contact with the first electrode, a second electrode being in contact with the dielectric body and being extended from the pixel electrode, wherein the electric device is one selected from the group consisting of a mobile computer, a head mount display, a portable telephone, a video camera, a still camera, a personal computer, a rear type projector, and a front type projector.

19. The device according to claim 18, wherein the impurity to give a conductivity to the first and the second conductive layers is an element selected from group 13 or group 15.

20. The device according to claim 18, wherein an impurity selected from group 13 or group 15 to control the threshold voltage is added to at least the channel forming region at a concentration in the range of $1\times10^{15}$–$5\times10^{17}$ atoms/cm$^3$.

21. The device according to claim 18, wherein the first crystalline semiconductor film of the thin film transistor includes at least an element selected from the group consisting of Ni, Ge, Pt, Co, Fe, Au, Pd, Pb and Cu.

22. The device according to claim 21, wherein a concentration of the element in the channel forming region is $5\times10^{17}$ atoms/cm$^3$ or lower.

23. An electric device including a display device, said display device comprising:

a plurality of gate wirings;

a plurality of source wirings;

a plurality of pixels each being located at an intersection of each of the plurality of gate wirings and each of the plurality of source wirings;

at least one thin film transistor in each of the plurality of pixels, said bottom gate type thin film transistor having a source region, a drain region, at least one channel forming region and a gate electrode adjacent to said channel forming region with a gate insulating film interposed therebetween;

at least a storage capacitor connected to a pixel electrode; and wherein each of the source region and the drain region comprises, at least a first conductive layer, at least a second conductive layer having a higher resistance than the first conductive layer, and at least a first semiconductor layer having a same conductive type as the channel forming region, wherein a concentration profile of an impurity to give a conductivity to the first and the second conductive layers is varied continuously from the first conductive layer to the second conductive layer, and wherein the storage capacitor comprises, a first electrode comprising a same conductive film as the gate wiring, a dielectric body in contact with the first electrode, and a second electrode comprising a second semiconductor layer being in contact with the dielectric body and having a same conductive type as the channel forming region, wherein the electric device is one selected from the group consisting of a mobile computer, a head mount display, a portable telephone, a video camera, a still camera, a personal computer, a rear type projector, and a front type projector.

24. The device according to claim 23, wherein the second semiconductor layer includes a region having a film thickness same as a film thickness of the channel forming region.

25. The device according to claim 23, wherein a film thickness of the second semiconductor layer is equal to a film thickness of the first semiconductor layer.

26. The device according to claim 23, wherein an impurity selected from group 13 or group 15 to control a threshold voltage is added to the second semiconductor layer at a concentration in the range of $1\times10^{15}$–$5\times10^{17}$ atoms/cm$^3$.

27. The device according claim 23, further comprising:

a third semiconductor layer in contact with the second semiconductor layer; and a fourth semiconductor layer in contact with the third semiconductor layer, wherein a concentration profile of an impurity to give a conductivity from the fourth semiconductor layer to the third semiconductor layer is substantially equal to the concentration profile of the first and second conductive layers.

28. The device according to claim 27, wherein the fourth semiconductor layer is connected to a drain electrode of the thin film transistor.

29. The device according to claim 27, wherein the fourth semiconductor layer is connected to the pixel electrode.

30. The device according to claim 23, wherein the impurity to give a conductivity to the first and second conductive layers is an element selected from group 13 or group 15.

31. An electric device including a display device, said display device comprising:

a plurality of gate wirings;

a plurality of source wirings;

a plurality of pixels each being located at an intersection of each of the plurality of gate wirings and each of the plurality of source wirings;

at least a bottom gate type thin film transistor in each of the plurality of pixels, said bottom gate type thin film transistor having a source region, a drain region, at least one channel forming region and a gate electrode adjacent to the channel forming region with a gate insulating film interposed therebetween;

at least a storage capacitor connected to a pixel electrode; and wherein each of the source region and the drain region comprises, at least a first conductive layer, at least a second conductive layer having a higher resistance than the first conductive layer, and at least a first semiconductor layer having a same conductive type as the channel forming region, wherein a concentration profile of an impurity to give a conductivity to the first and the second conductive layers is varied continuously from the first conductive layer to the second conductive layer, and wherein the storage capacitor comprises, a first electrode of the capacitor comprising a first conductive film common to the gate wiring, a dielectric body in contact with the first electrode, a second electrode being in contact with the dielectric body and comprising a second conductive film common to the source wiring, wherein the electric device is one selected from the group consisting of a mobile computer, a head mount display, a portable telephone, a video camera, a still camera, a personal computer, a rear type projector, and a front type projector.

32. The device according to claim 31, wherein the second electrode of the storage capacitor is integrally formed with a drain electrode of the thin film transistor.

33. The device according to claim 31, wherein an impurity to give a conductivity to the first and the second conductive layers is an element selected from group 13 or group 15.

34. The device according to claim 31, wherein an impurity selected from group 13 or group 15 to control the threshold voltage is added to at least the channel forming region at a concentration in the range of $1\times10^{15}$–$5\times10^{17}$ atoms/cm$^3$.

35. An electric device including a display device, said display device comprising:

a plurality of gate wirings;

a plurality of source wirings;

a plurality of pixels each being located at an intersection of each of the plurality of gate wirings and each of the plurality of source wirings;

at least a bottom gate type thin film transistor in each of the plurality of pixels, said bottom gate type thin film transistor having a source region, a drain region, at least one channel forming region and a gate electrode adjacent to the channel forming region with a gate insulating film interposed therebetween;

at least a storage capacitor connected to a pixel electrode; and wherein each of the source region and the drain region comprises, at least a first conductive layer, at least a second conductive layer having a higher resistance than the first conductive layer, and at least a first semiconductor layer having a same conductive type as the channel forming region;

wherein a concentration profile of an impurity to give a conductivity to the first and the second conductive layers is varied continuously from the first conductive layer to the second conductive layer, wherein the storage capacitor comprises, a first electrode comprising a first conductive film common to the gate wiring, a dielectric body in contact with the first electrode, a second electrode being in contact with the dielectric body and being extended from the pixel electrode, wherein the electric device is one selected from the group consisting of a mobile computer, a head mount display, a portable telephone, a video camera, a rear type projector, and a front type projector.

36. The device according to claim 35, wherein the impurity to give a conductivity to the first and the second conductive layers is an element selected from group 13 or group 15.

37. The device according to claim 35, wherein an impurity selected from group 13 or group 15 to control the threshold voltage is added to at least the channel forming region at a concentration in the range of $1\times10^{15}$–$5\times10^{17}$ atoms/cm$^3$.

* * * * *